(12) United States Patent
Sasami et al.

(10) Patent No.: US 11,609,497 B2
(45) Date of Patent: Mar. 21, 2023

(54) RESIST COMPOSITION AND PATTERNING PROCESS

(71) Applicant: SHIN-ETSU CHEMICAL CO., LTD., Tokyo (JP)

(72) Inventors: Takeshi Sasami, Joetsu (JP); Kenji Yamada, Joetsu (JP); Jun Hatakeyama, Joetsu (JP); Satoshi Watanabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 485 days.

(21) Appl. No.: 16/730,785

(22) Filed: Dec. 30, 2019

(65) Prior Publication Data

US 2020/0218154 A1 Jul. 9, 2020

(30) Foreign Application Priority Data

Jan. 8, 2019 (JP) .............................. JP2019-001476

(51) Int. Cl.
*G03F 7/039* (2006.01)
*C07C 381/12* (2006.01)
(Continued)

(52) U.S. Cl.
CPC .......... *G03F 7/0392* (2013.01); *C08F 212/08* (2013.01); *C08F 220/24* (2013.01);
(Continued)

(58) Field of Classification Search
CPC ................ C07C 381/12; C08F 220/24; C08F 220/282; C08F 220/382; C08F 212/08; C08F 220/30; G03F 7/004; G03F 7/0392
See application file for complete search history.

(56) References Cited

U.S. PATENT DOCUMENTS

| | | | | |
|---|---|---|---|---|
| 5,650,483 A | | 7/1997 | Malik et al. | |
| 8,865,389 B2 * | | 10/2014 | Hirano | G03F 7/0046 430/945 |
| 8,877,423 B2 * | | 11/2014 | Fujii | C08F 12/24 430/913 |
| 8,968,982 B2 * | | 3/2015 | Yasuda | G03F 7/0392 430/326 |
| 8,980,525 B2 * | | 3/2015 | Yasuda | G03F 7/0397 430/315 |
| 9,140,984 B2 * | | 9/2015 | Yada | G03F 7/0392 |

(Continued)

FOREIGN PATENT DOCUMENTS

| | | | | |
|---|---|---|---|---|
| EP | 1117003 A1 * | 7/2001 | ......... | G03F 7/0045 |
| JP | 2000-241965 A | 9/2000 | | |

(Continued)

OTHER PUBLICATIONS

Apr. 15, 2021 Office Action issued in Korean Patent Application No. 10-2020-0001415.
Nov. 29, 2022 Office Action issued in Japanese Application No. 2019-222959.

*Primary Examiner* — Amanda C. Walke
(74) *Attorney, Agent, or Firm* — Oliff PLC

(57) ABSTRACT

The present invention is a resist composition comprises a polymer compound having one or two repeating units selected from repeating units represented by the following general formulae (p-1), (p-2) and (p-3), a repeating unit represented by the following formula (a-1) and the formula (a-2) polarities of which are changed by an action of an acid, and a repeating unit represented by the following formula (b-1); a salt represented by the following general formula (B); and a solvent, wherein a difference of a C log P of the repeating unit (a-1) before and after changing the polarity is 3.0 to 4.5, and a difference of a C log P of the repeating unit (a-2) before and after changing the polarity is 2.5 to 3.2. This provides a resist composition which has high sensitivity, wide DOF and high resolution, reduces LER, LWR and CDU, and has good pattern shape after exposure and excellent etching resistance.

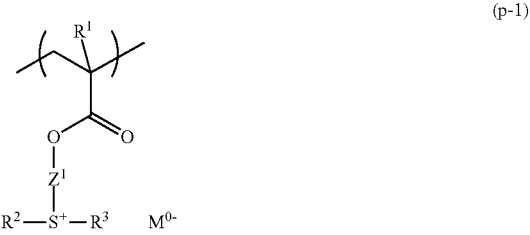

(p-1)

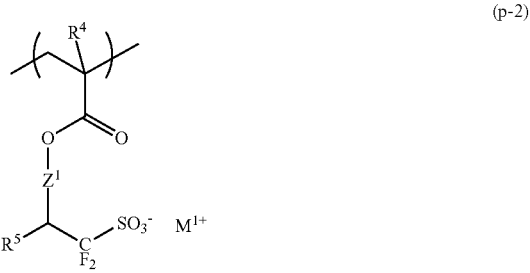

(p-2)

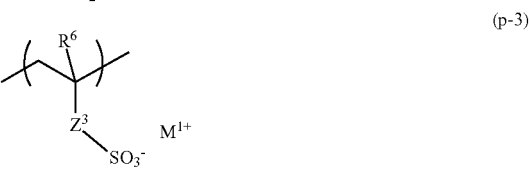

(p-3)

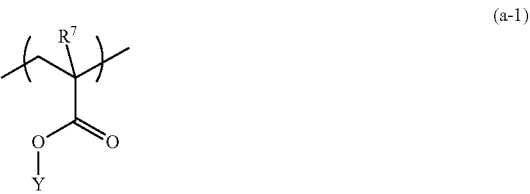

(a-1)

(Continued)

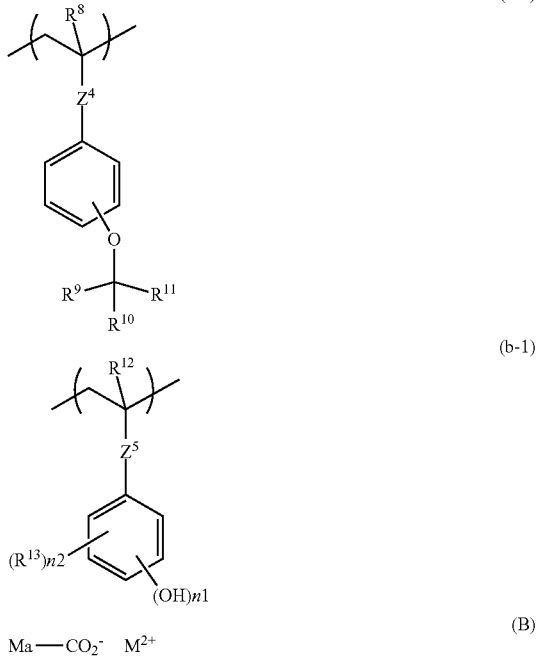

(56) References Cited

U.S. PATENT DOCUMENTS

| | | | |
|---|---|---|---|
| 9,519,217 B2* | 12/2016 | Takemura | G03F 7/0392 |
| 9,645,493 B2* | 5/2017 | Domon | G03F 7/327 |
| 10,948,822 B2* | 3/2021 | Hatakeyama | C08F 212/20 |
| 2001/0038970 A1 | 11/2001 | Cameron et al. | |
| 2003/0044717 A1 | 3/2003 | Kodama | |
| 2008/0090172 A1 | 4/2008 | Hatakeyama et al. | |
| 2008/0118860 A1 | 5/2008 | Harada et al. | |
| 2009/0081588 A1 | 3/2009 | Hatakeyama et al. | |
| 2009/0111047 A1 | 4/2009 | Yamashita | |
| 2009/0208867 A1 | 8/2009 | Harada et al. | |
| 2009/0208873 A1 | 8/2009 | Harada et al. | |
| 2009/0280434 A1 | 11/2009 | Harada et al. | |
| 2010/0112482 A1 | 5/2010 | Watanabe et al. | |
| 2010/0136482 A1 | 6/2010 | Harada et al. | |
| 2010/0209827 A1 | 8/2010 | Ohashi et al. | |
| 2011/0008735 A1 | 1/2011 | Ohsawa et al. | |
| 2012/0164577 A1 | 6/2012 | Taniguchi et al. | |
| 2015/0086926 A1 | 3/2015 | Ohashi et al. | |
| 2015/0125794 A1* | 5/2015 | Hatakeyama | G03F 7/2041 430/296 |
| 2016/0152755 A1* | 6/2016 | Fujiwara | C08F 224/00 430/296 |
| 2017/0115567 A1* | 4/2017 | Hirano | G06F 7/40 |
| 2017/0210836 A1* | 7/2017 | Domon | G03F 7/0045 |
| 2017/0315442 A1* | 11/2017 | Fukushima | C07C 271/24 |
| 2018/0101094 A1 | 4/2018 | Hatakeyama et al. | |
| 2018/0373148 A1 | 12/2018 | Hatakeyama et al. | |

FOREIGN PATENT DOCUMENTS

| | | |
|---|---|---|
| JP | 2003-005376 A | 1/2003 |
| JP | 3790649 B2 | 6/2006 |
| JP | 2008-111103 A | 5/2008 |
| JP | 2008-122932 A | 5/2008 |
| JP | 2009-098638 A | 5/2009 |
| JP | 2009-109595 A | 5/2009 |
| JP | 2009-191151 A | 8/2009 |
| JP | 2009-192784 A | 8/2009 |
| JP | 2009-276363 A | 11/2009 |
| JP | 2010-107695 A | 5/2010 |
| JP | 2010-134012 A | 6/2010 |
| JP | 2010-215608 A | 9/2010 |
| JP | 2010-250105 A | 11/2010 |
| JP | 2011-016746 A | 1/2011 |
| JP | 2011-042789 A | 3/2011 |
| JP | 2012-046501 A | 3/2012 |
| JP | 2012-137518 A | 7/2012 |
| JP | 2015-054833 A | 3/2015 |
| JP | 2018-060069 A | 4/2018 |
| KR | 1020180138539 A | 12/2018 |

\* cited by examiner

15 Claims, No Drawings

(51) Int. Cl.
  *G03F 7/004* (2006.01)
  *G03F 7/20* (2006.01)
  *C08F 212/08* (2006.01)
  *C08F 220/38* (2006.01)
  *C08F 220/28* (2006.01)
  *C08F 220/24* (2006.01)
  *G03F 7/32* (2006.01)
  *C08K 5/095* (2006.01)
  *C08F 220/30* (2006.01)

(52) U.S. Cl.
  CPC ........ *C08F 220/282* (2020.02); *C08F 220/30* (2013.01); *C08F 220/382* (2020.02); *C08K 5/095* (2013.01); *G03F 7/0045* (2013.01); *G03F 7/0397* (2013.01); *G03F 7/2004* (2013.01); *G03F 7/32* (2013.01)

RESIST COMPOSITION AND PATTERNING PROCESS

TECHNICAL FIELD

The present invention relates to a resist composition and a patterning process using the resist composition.

BACKGROUND ART

Accompanied with high integration and high speed of LSI, miniaturization of pattern rule is progressing rapidly. In particular, expansion of flash memory market and increase in memory capacity are leading to miniaturization. As the state-of-the-art miniaturization technology, mass production of a device with 65 nm node by ArF lithography is being carried out, and preparation of mass production of 45 nm node by ArF immersion lithography of the next generation is now in progressing. As 32 nm node of the next generation, there are candidates of immersion lithography by ultra-high NA lenses using a liquid having a higher refractive index than that of water and a lens having a high refractive index, and a higher refractive index material in combination, extreme ultraviolet (EUV) lithography with a wavelength of 13.5 nm, ArF lithography with double exposure (double patterning lithography), and the like, and investigation is in progressing.

In order to improve resolution and dimensional controllability in high energy beam, the resist film tends to be low sensitivity. Lowering in sensitivity of the resist film leads to lowering in productivity, which is not preferable. From the demand of making high sensitivity, chemically amplified type resist materials are being investigated.

With the progress of miniaturization, edge roughness (line edge roughness: LER and line width roughness: LWR) of line patterns and dimension uniformity (critical dimension uniformity: CDU) of hole patterns are regarded as problems. It has been pointed out that dissolution contrast of a base polymer to a developing solution, influence of localization or agglomeration of an acid generator, and influence of acid diffusion. Further, accompanied with thinning of the resist film, LER tends to be large, and deterioration of LER and etching resistance by thinning the film accompanied with the progress of miniaturization is a serious problem.

In the formation of a positive type fine line pattern, when a base polymer containing a bulky and high-contrast acid leaving group is used, it becomes a T-top shape, and deterioration of edge roughness and clogging of hole pattern occur. To the contrary, when a base polymer containing a compact acid leaving group is used, a residual film thickness of an unexposed portion to the developing solution is lowered and the pattern is easily collapsed. It has been desired to develop an excellent resist by taking a balance between the dissolution contrast and control of acid diffusion to improve resolution.

In Patent Document 1, it has been reported that lithographic characteristics are remarkably improved by using two kinds of photoacid generators having different acid strengths. In Patent Document 2, it has been reported that density dependence of line and space becomes small by using a sulfonium salt which generates an alkane sulfonic acid in which the α-position of the sulfonic acid is substituted by a fluorine atom and a sulfonium salt which generates an alkane sulfonic acid in which the α-position of the sulfonic acid is not substituted by fluorine in combination. In Patent Document 3, it has been reported that depth of focus of the hole pattern or the trench pattern and circularity or LWR are improved by using a polymer compound containing a photoacid generator which generates an alkane sulfonic acid in which the α-position of which has been substituted by a fluorine atom, with an acid generator generating an alkane sulfonic acid in which an α-position of the sulfonic acid is not substituted by fluorine in combination. This effect is attributed by the fact that acid strength of the alkane sulfonic acid in which the α-position of which has been substituted by a fluorine atom is higher than that of the alkane sulfonic acid which is not substituted by fluorine. These prior art techniques are considered that a strong acid generated from a photoacid generator by exposure performs salt exchange with a weak acid onium salt to form a strong acid onium salt, whereby the strong acid having high acidity is replaced with a weak acid which suppresses an acid-generating decomposition reaction of an acid labile group to shorten an acid diffusion distance. That is, the weak acid onium salt is considered to function as a quencher (acid deactivator) to the strong acid generated by exposure. As compared with a nitrogen-containing compound such as amines, etc., the weak acid onium salt is generally non-volatile, so that it can prevent from changing the concentration of the surface layer of the resist film during formation of the resist film and a baking process for patterning, which makes it possible to form good rectangular shape of the pattern.

In Patent Document 4, it has been reported that in the case of using an onium alkane sulfonate, the acidity thereof is not sufficiently low as compared to a carboxylic acid onium salt, so that quenching ability is low, and resolution, edge roughness, depth of focus, etc. cannot be satisfied.

CITATION LIST

Patent Literature

Patent Document 1: Japanese Patent Laid-Open Publication No. 2000-241965
Patent Document 2: Japanese Patent Laid-Open Publication No. 2003-005376
Patent Document 3: Japanese Patent Laid-Open Publication No. 2012-137518
Patent Document 4: Japanese Patent Laid-Open Publication No. 2015-054833

SUMMARY OF INVENTION

Technical Problem

The present invention has been made in view of the above-mentioned circumstances, and an object thereof is to provide a resist composition having high sensitivity superior to the conventional resist materials, wide depth of focus (DOF) and high resolution, being reduced in edge roughness (LER and LWR) and critical dimension uniformity (CDU) of hole pattern, having good pattern shape after exposure and excellent etching resistance, which is a resist composition using a polymer compound suitable as a base resin of the resist composition and a salt excellent in control of acid diffusion, and a patterning process using the resist composition.

Solution to Problem

In order to achieve the above-mentioned tasks, in the present invention, it is provided a resist composition including: a polymer compound having one or two repeating units selected from repeating units represented by the following general formulae (p-1), (p-2) and (p-3), a repeating unit represented by the following formula (a-1) and the formula (a-2) polarities of which are changed by an action of an acid, and a repeating unit represented by the following formula (b-1); a salt represented by the following general formula (B); and a solvent, wherein a difference between a C log P of the repeating unit (a-1) and a C log P of the repeating unit (a-1) after changing the polarity thereof by an action of an acid is 3.0 to 4.5, and a difference between a C log P of the repeating unit (a-2) and a C log P of the repeating unit (a-2) after changing the polarity thereof by an action of an acid is 2.5 to 3.2.

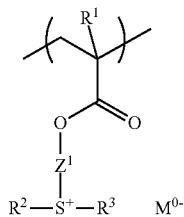
(p-1)

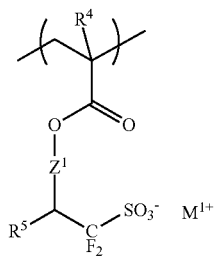
(p-2)

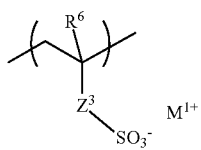
(p-3)

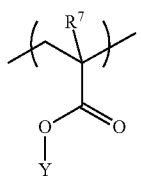
(a-1)

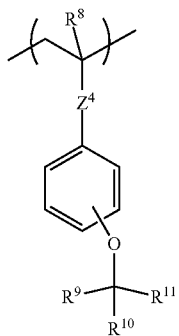
(a-2)

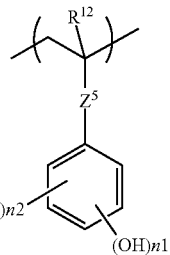
(b-1)

(In the above-mentioned formulae (p-1), (p-2) and (p-3), $R^1$, $R^4$ and $R^6$ are each independently a hydrogen atom or a methyl group. $Z^1$ is a single bond, a phenylene group, —O—Z(=O)—O—$Z^{11}$— or —C(=O)—NH—$Z^{11}$—, $Z^{11}$ is an alkanediyl group having 1 to 6 carbon atoms or an alkenediyl group having 2 to 6 carbon atoms, or a phenylene group, each of which may contain a carbonyl group, an ester bond, an ether bond or a hydroxyl group. $Z^2$ is a single bond, —$Z^{21}$—C(=O)—O—, —$Z^{21}$—O— or —$Z^{21}$—O—C(=O)—, $Z^{21}$ is an alkanediyl group having 1 to 12 carbon atoms, and may contain a carbonyl group, an ester bond or an ether bond. $R^2$ to $R^3$ are each independently a monovalent hydrocarbon group having 1 to 20 carbon atoms which may contain a hetero atom(s). $R^5$ is a hydrogen atom or a trifluoromethyl group. $Z^3$ is a single bond, a methylene group, an ethylene group, a phenylene group, a fluorinated phenylene group, —O—$Z^{31}$—, —C(=O)—O—$Z^{31}$— or —C(=O)—NH—$Z^{31}$—, $Z^{31}$ is an alkylene group having 1 to 6 carbon atoms, a phenylene group, a fluorinated phenylene group, a phenylene group substituted with a trifluoromethyl group, or a linear, branched or cyclic alkenylene group having 2 to 6 carbon atoms, each of which may contain a carbonyl group, an ester bond, an ether bond or a hydroxyl group. Also, $M^{1+}$ represents a counter cation having a substituent(s), and represents a sulfonium cation, an iodonium cation or an ammonium cation. $M^{0-}$ is a non-nucleophilic counter ion. In the above-mentioned formula (a-1), $R^7$ is a hydrogen atom or a methyl group. Y has a structure that changes its polarity by an action of an acid and becomes soluble in an aqueous alkali solution. In the above-mentioned formula (a-2), $R^8$ is a hydrogen atom or a methyl group. $Z^4$ is a single bond, a methylene group, an ethylene group, a phenylene group, a fluorinated phenylene group, —O—$Z^{41}$—, —C(=O)—O—$Z^{41}$— or —C(=O)—NH—$Z^{41}$—, $Z^{41}$ is an alkanediyl group having 1 to 12 carbon atoms, and may contain a carbonyl group, an ester bond or an ether bond. $R^9$ to $R^{11}$ each independently represent a hydrocarbon group which is linear having 1 to 10 carbon atoms, or branched or cyclic having 3 to 10 carbon atoms, and two of which may be bonded to each other to form a ring. In the above-mentioned formula (b-1), $R^{12}$ is a hydrogen atom or a methyl group. $Z^5$ is a single bond, a methylene group, an ethylene group, a phenylene group, a fluorinated phenylene group, —O—$Z^{51}$—, —C(=O)—O—$Z^{51}$— or —C(=O)—NH—$Z^{51}$—, and $Z^{51}$ is an alkanediyl group having 1 to 12 carbon atoms, and may contain a carbonyl group, an ester bond or an ether bond. n1 is an integer of 1 to 3, n2 is an integer of 0 to 3 and a sum of n1 and n2 is 5 or less. $R^{13}$ is a halogen atom or a hydrocarbon group which is linear having 1 to 10 carbon atoms, or branched or cyclic having 3 to 10 carbon atoms, —$CH_2$— constituting the hydrocarbon group may be replaced by —O—, —C(=O)—O— or —C(=O)—, or a hydrogen atom constituting the hydrocarbon group may be substituted with a halogen atom or a hetero atom;)

$$Ma\text{-}CO_2^- M^{2+} \tag{B}$$

(In the formula (B), Ma represents a linear, branched or cyclic monovalent hydrocarbon group having 1 to 35 carbon atoms which may contain an oxygen atom(s). Also, one or more hydrogen atoms bonded to the carbon atom may be substituted with a fluorine atom(s); and $M^{2+}$ represents a counter cation having a substituent(s), and is a sulfonium cation, an iodonium cation or an ammonium cation.)

When the resist composition of the present invention is employed, it has high sensitivity, wide depth of focus (DOF) and high resolution, reduces edge roughness (LER and LWR) and critical dimension uniformity (CDU) of a hole pattern, and has a good pattern shape after exposure and excellent etching resistance.

The resist composition of the present invention may have a structure in which the polymer compound further contains a repeating unit having a lactone structure represented by the following general formula (c-1).

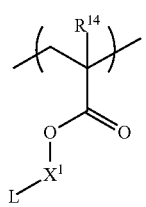
(c-1)

(In the formula (c-1), $R^{14}$ is a hydrogen atom or a methyl group. $X^1$ is a single bond or a hydrocarbon group having 1 to 5 carbon atoms and —$CH_2$— constituting the hydrocarbon group may be replaced by —O—, —C(=O)—O— or —C(=O)—. L is a group having a lactone structure.)

When such a resist composition is employed, the resist film to be formed becomes a material having excellent adhesiveness, and a resist pattern having a more preferable shape can be obtained.

In this case, L in the above-mentioned formula (c-1) is preferably a group represented by any of the following formulae (c-1-1), (c-1-2) and (c-1-3).

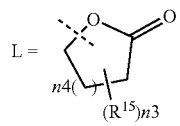
(c-1-1)

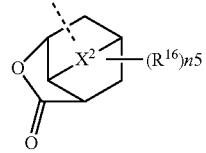
(c-1-2)

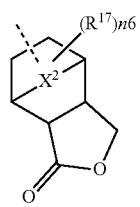
(c-1-3)

(In the formula (c-1-1), n3 is an integer of 1 to 4, $R^{15}$ is a hydrocarbon group which is linear having 1 to 10 carbon atoms, or branched or cyclic having 3 to 10 carbon atoms, and —$CH_2$— constituting the hydrocarbon group may be replaced by —O—, —C(=O)—O— or —C(=O)—, or a hydrogen atom constituting the hydrocarbon group may be substituted with a halogen atom or a hetero atom. n4 represents a linking group having 1 to 5 carbon atoms. In the formula (c-1-2), $X^2$ is a single bond or a hydrocarbon group having 1 to 5 carbon atoms and —$CH_2$— constituting the hydrocarbon group may be replaced by —O— or —C(=O)—. n5 is an integer of 1 to 4, $R^{16}$ is a hydrocarbon group which is linear having 1 to 10 carbon atoms, or branched or cyclic having 3 to 10 carbon atoms, and —$CH_2$— constituting the hydrocarbon group may be replaced by —O—, —C(=O)—O— or —C(=O)—, or a hydrogen atom constituting the hydrocarbon group may be substituted with a halogen atom or a hetero atom. In the formula (c-1-3), $X^3$ is a single bond or a hydrocarbon group having 1 to 5 carbon atoms and —$CH_2$-constituting the hydrocarbon group may be replaced by —O— or —C(=O)—. n6 is an integer of 1 to 4, $R^{17}$ is a hydrocarbon group which is linear having 1 to 10 carbon atoms, or branched or cyclic having 3 to 10 carbon atoms, —$CH_2$— constituting the hydrocarbon group may be replaced by —O—, —C(=O)—O— or —C(=O)—, or a hydrogen atom constituting the hydrocarbon group may be substituted with a halogen atom or a hetero atom.)

When such a resist composition is employed, the resist film becomes a material having more excellent adhesiveness.

In the resist composition of the present invention, the difference between a C log P of the repeating unit (a-1) and a C log P after the polarity of the repeating unit (a-1) has been changed by an action of an acid is preferably 3.3 to 4.2.

When such a resist composition is employed, it is more difficultly to cause that the hole pattern is clogged or T-top shape is generated in the line pattern, and the depth of focus becomes more preferable.

In addition, in the resist composition of the present invention, the salt represented by the general formula (B) can be a salt represented by the following formula (B1).

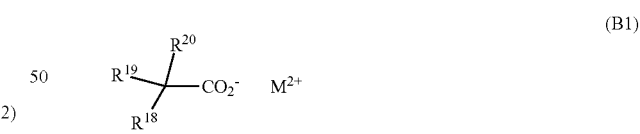
(B1)

(In the formula (B1), $R^{18}$ to $R^{19}$ each independently represent a hydrogen atom, a fluorine atom or a trifluoromethyl group. $R^{20}$ represents a hydrogen atom, a hydroxyl group, a linear, branched or cyclic, substituted or unsubstituted alkyl group having 1 to 20 carbon atoms, or a substituted or unsubstituted aryl group having 6 to 30 carbon atoms. $M^{2+}$ represents a counter cation having a substituent(s), a sulfonium cation, an iodonium cation or an ammonium cation.)

When such a resist composition is employed, a resist film excellent in resolution can be provided.

Also, the resist composition of the present invention may further contain a salt represented by the following formula (B2).

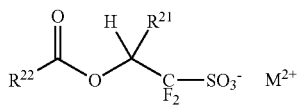
(B2)

(In the formula (B2), $R^{21}$ represents a hydrogen atom or a trifluoromethyl group. $R^{22}$ represents a linear, branched or cyclic monovalent hydrocarbon group having 1 to 35 carbon atoms which may contain an oxygen atom(s). Also, one or more hydrogen atoms bonded to the carbon atom may be substituted with a fluorine atom(s). $M^{2+}$ represents a counter cation having a substituent(s), a sulfonium cation, an iodonium cation or an ammonium cation.)

When such a resist composition is employed, acid strength of the onium salt can be controlled, so that a resist film more excellent in resolution can be provided.

Further, in the resist composition of the present invention, the repeating unit represented by the above-mentioned formula (a-2) can be a repeating unit represented by the following formula (a-2-1).

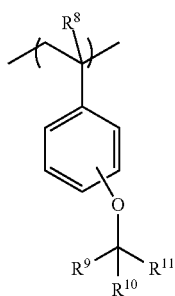
(a-2-1)

(In the formula (a-2-1), $R^8$ to $R^{11}$ are as defined above.)

When such a resist composition is employed, swelling to the alkaline developing solution can be more suppressed, collapse of pattern can be prevented, and depth of focus can be broadened.

In addition, the present invention is to provide a patterning process which is a patterning process which includes: forming a resist film on a substrate using the above-mentioned resist composition, laying a mask over the resist film, exposing by irradiating a high energy beam, then, developing with an alkali developing solution to form a pattern on the substrate, wherein the exposure by the high energy beam is carried out by a KrF excimer laser having a wavelength of 248 nm, an ArF excimer laser having a wavelength of 193 nm, EUV having a wavelength of 13.5 nm, or an electron beam.

When such a patterning process is employed, a resist pattern having high sensitivity, wide depth of focus (DOF) and high resolution, being reduced in edge roughness (LER and LWR) or critical dimension uniformity (CDU) of a hole pattern, and having good pattern shape after exposure and excellent etching resistance can be formed.

Advantageous Effects of Invention

The resist composition of the present invention has a high alkali dissolution contrast before and after exposure, and has wide depth of focus and high resolution by preventing pattern collapse by suppressing swelling in an alkali developing solution and shows good pattern shape and edge roughness after the exposure. Accordingly, a positive type resist composition suitable for a pattern forming material particularly for manufacturing super LSI or for EUV exposure, and particularly a chemically amplified positive type resist composition can be obtained.

DESCRIPTION OF EMBODIMENTS

As mentioned above, it has been desired to develop a resist composition capable of forming a resist pattern which has high sensitivity, wide depth of focus (DOF) and high resolution, is capable of reducing edge roughness (LER and LWR) or critical dimension uniformity (CDU) of a hole pattern, and has good pattern shape after exposure and excellent etching resistance.

As a result of earnest studies to accomplish the above-mentioned objects, it has been found that a resist composition containing a polymer compound having a repeating unit in which (meth)acrylic acid is protected by an acid labile group, a repeating unit in which a phenolic hydroxyl group is protected by an acid labile group and a repeating unit obtained from an onium salt has high sensitivity and high resolution, reduces line edge roughness (LER) and line width roughness (LWR), and enables fine processing in which pattern shape is good, whereby the present invention has been achieved.

That is, the present invention is directed to a resist composition which includes a polymer compound having one or two repeating units selected from repeating units represented by the following general formulae (p-1), (p-2) and (p-3), a repeating unit represented by the following formula (a-1) and the formula (a-2) polarities of which are changed by an action of an acid, and a repeating unit represented by the following formula (b-1); a salt represented by the following general formula (B); and a solvent, wherein a difference between a C log P of the repeating unit (a-1) and a C log P of the repeating unit (a-1) after changing the polarity thereof by an action of an acid is 3.0 to 4.5, and a difference between a C log P of the repeating unit (a-2) and a C log P of the repeating unit (a-2) after changing the polarity thereof by an action of an acid is 2.5 to 3.2.

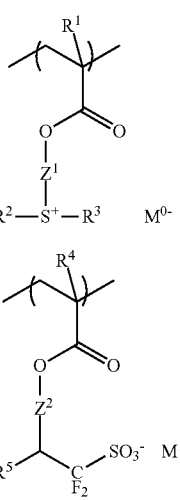

(p-1)

(p-2)

-continued (p-3)
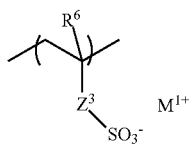

(a-1)
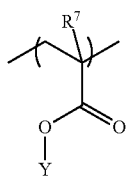

(a-2)
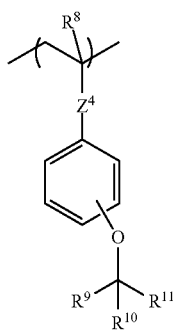

(b-1)
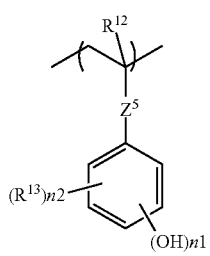

(In the above-mentioned formula (p-1), (p-2) and (p-3), $R^1$, $R^4$ and $R^6$ are each independently a hydrogen atom or a methyl group. $Z^1$ is a single bond, a phenylene group, —O—$Z^{11}$—, —C(=O)—O—$Z^{11}$—, or —C(=O)—NH—$Z^{11}$—, $Z^{11}$ is an alkanediyl group having 1 to 6 carbon atoms or an alkenediyl group having 2 to 6 carbon atoms, or a phenylene group, each of which may contain a carbonyl group, an ester bond, an ether bond or a hydroxyl group. $Z^2$ is a single bond, —$Z^{21}$—C(=O)—O—, —$Z^{21}$—O— or —$Z^{21}$—O—C(=O)—, $Z^{21}$ is an alkanediyl group having 1 to 12 carbon atoms, and may contain a carbonyl group, an ester bond or an ether bond. $R^2$ to $R^3$ are each independently a monovalent hydrocarbon group having 1 to 20 carbon atoms which may contain a hetero atom(s). $R^5$ is a hydrogen atom or a trifluoromethyl group. $Z^3$ is a single bond, a methylene group, an ethylene group, a phenylene group, a fluorinated phenylene group, —O—$Z^{31}$—, —C(=O)—O—$Z^{31}$— or —C(=O)—NH—$Z^{31}$—, $Z^{31}$ is an alkylene group having 1 to 6 carbon atoms, a phenylene group, a fluorinated phenylene group, a phenylene group substituted with a trifluoromethyl group, or a linear, branched or cyclic alkenylene group having 2 to 6 carbon atoms, each of which may contain a carbonyl group, an ester bond, an ether bond or a hydroxyl group. Also, $M^{1+}$ represents a counter cation having a substituent(s), and represents a sulfonium cation, an iodonium cation or an ammonium cation. $M^{0-}$ is a non-nucleophilic counter ion. In the above-mentioned formula (a-1), $R^7$ is a hydrogen atom or a methyl group. Y has a structure that changes its polarity by an action of an acid and becomes soluble in an aqueous alkali solution. In the above-mentioned formula (a-2), $R^8$ is a hydrogen atom or a methyl group. $Z^4$ is a single bond, a methylene group, an ethylene group, a phenylene group, a fluorinated phenylene group, —O—$Z^{41}$—, —C(=O)—O—$Z^{41}$— or —C(=O)—NH—$Z^{41}$—, $Z^{41}$ is an alkanediyl group having 1 to 12 carbon atoms, and may contain a carbonyl group, an ester bond or an ether bond. $R^9$ to $R^{11}$ each independently represent a hydrocarbon group which is linear having 1 to 10 carbon atoms, or branched or cyclic having 3 to 10 carbon atoms, and two of which may be bonded to each other to form a ring. In the above-mentioned formula (b-1), $R^{12}$ is a hydrogen atom or a methyl group. $Z^5$ is a single bond, a methylene group, an ethylene group, a phenylene group, a fluorinated phenylene group, —O—$Z^{51}$—, —C(=O)—O—$Z^{51}$— or —C(=O)—NH—$Z^{51}$—, $Z^{51}$ is an alkanediyl group having 1 to 12 carbon atoms, and may contain a carbonyl group, an ester bond or an ether bond. n1 is an integer of 1 to 3, n2 is an integer of 0 to 3 and a sum of n1 and n2 is 5 or less. $R^{13}$ is a halogen atom or a hydrocarbon group which is linear having 1 to 10 carbon atoms, or branched or cyclic having 3 to 10 carbon atoms, —CH$_2$-constituting the hydrocarbon group may be replaced by —O—, —C(=O)—O— or —C(=O)—, or a hydrogen atom constituting the hydrocarbon group may be substituted with a halogen atom or a hetero atom;)

$$Ma\text{-}CO_2^-M^{2+} \quad (B)$$

(In the formula (B), Ma represents a linear, branched or cyclic monovalent hydrocarbon group having 1 to 35 carbon atoms which may contain an oxygen atom(s). Also, one or more hydrogen atoms bonded to the carbon atom may be substituted with a fluorine atom(s); and $M^{2+}$ represents a counter cation having a substituent(s), and is a sulfonium cation, an iodonium cation or an ammonium cation.)

In the following, the present invention will be explained in detail, but the present invention is not limited by these.

[Resist Composition]

The resist composition of the present invention is directed to a resist composition which comprises a polymer compound having one or two repeating units selected from repeating units represented by the following general formulae (p-1), (p-2) and (p-3), a repeating unit represented by the following formula (a-1) and the formula (a-2) polarities of which are changed by an action of an acid, and a repeating unit represented by the following formula (b-1); a salt represented by the following general formula (B); and a solvent, wherein a difference between a C log P of the repeating unit (a-1) and a C log P of the repeating unit (a-1) after changing the polarity thereof by an action of an acid is 3.0 to 4.5, and a difference between a C log P of the repeating unit (a-2) and a C log P of the repeating unit (a-2) after changing the polarity thereof by an action of an acid is 2.5 to 3.2.

(p-1)
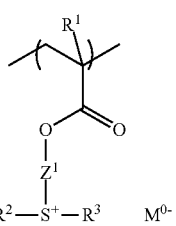

-continued

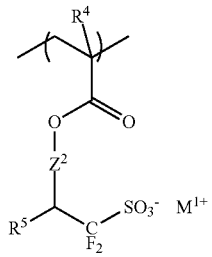
(p-2)

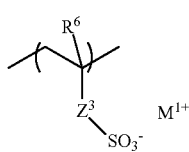
(p-3)

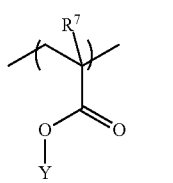
(a-1)

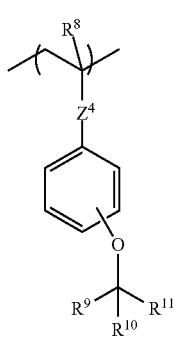
(a-2)

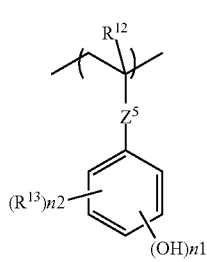
(b-1)

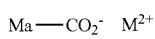
(B)

The above-mentioned polymer compound is sensitive to high energy beam, heat and so on to generate an acid.

In the present invention, the high energy beam includes ultraviolet rays, far ultraviolet rays, electron beams, EUV (extreme ultraviolet rays), X-rays, excimer lasers, gamma rays, and synchrotron radiation.

As mentioned below, characteristics corresponding to the above-mentioned respective repeating units are provided to the resist film obtained from the composition.

Styrene having an acid labile group is excellent in etching resistance than methacrylate in which an ester is substituted with an acid labile group which is somewhat compact, and after the acid labile group is eliminated by an acid, an amount of swelling by an alkali developing solution is small and pattern collapse is small.

From the viewpoint of dissolution contrast by an alkali developing solution, a methacrylate protected by an acid labile group which generates a carboxylic acid is more advantageous than the repeating unit which generates a phenolic hydroxyl group. However, generation of the carboxylic acid causes swelling in the developing solution, and pattern collapse occurs thereby. On the other hand, in the case of a repeating unit having an acid labile group which generates a phenolic hydroxyl group, there is a merit that the amount of swelling is small, but as compared with the type generating a carboxylic acid, dissolution contrast is inferior. Thus, in order to obtain both characteristics of improvement in dissolution contrast and reduction in the amount of swelling, repeating units in which a methacrylic acid and a phenolic hydroxyl group are protected by an acid labile group are protected.

The phenol group has a sensitizing action to EB and EUV, and has a swelling-suppressing effect in an alkali developing solution. By having the phenol group in the polymer compound, generation efficiency of secondary electrons and sensitization effect at the time of exposure are heightened, and decomposition efficiency of the acid generator is heightened whereby sensitivity is improved.

By containing the photoacid generator in the polymer compound, as compared with the conventional addition type photoacid generator, it has a high effect of suppressing acid diffusion, has high resolution and exposure margin, is excellent in process adaptability, and has good pattern shape after exposure.

As compared with an α-fluoroalkane sulfonic acid, by using a weak acid onium salt in combination as a quencher component, the weak acid onium salt is generally non-volatile so that, as compared with a nitrogen-containing compound such as amines, it can prevent from changing its concentration in the surface layer of the resist film at the time of forming the resist film or during the baking process for patterning, which makes it possible to form a good rectangular shape. Further, by using a carboxylic acid onium salt which has lower acidity than that of the alkane sulfonic acid having no fluorine atom at the α-position and has high quenching ability as the weak acid onium salt, it has high effect in suppressing diffusion of the acid, has high resolution and exposure margin, and is excellent in process adaptability.

The resist composition of the present invention becomes a resist composition, by having the above-mentioned constitution, which can form a resist pattern having high sensitivity, wide depth of focus (DOF) and high resolution, being reduced in edge roughness (LER and LWR) and critical dimension uniformity (CDU) of hole pattern, and having good pattern shape after exposure and excellent etching resistance.

In the following, constitutional components of the resist composition of the present invention will be explained.

[Repeating Units (p-1), (p-2) and (p-3)]

The polymer compound constituting the resist composition of the present invention has one or two repeating units selected from the repeating units represented by the following general formulae (p-1), (p-2) and (p-3).

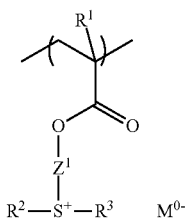
(p-1)

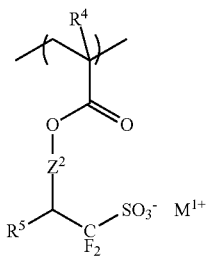
(p-2)

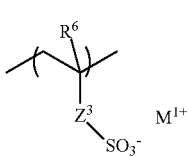
(p-3)

In the above-mentioned formulae (p-1), (p-2) and (p-3), $R^1$, $R^4$ and $R^6$ are each independently a hydrogen atom or a methyl group. $Z^1$ is a single bond, a phenylene group, —O—$Z^{11}$—, —C(=O)—O—$Z^{11}$— or —C(=O)—NH—$Z^{11}$—, $Z^{11}$ is an alkanediyl group having 1 to 6 carbon atoms or an alkenediyl group having 2 to 6 carbon atoms, or a phenylene group, each of which may contain a carbonyl group, an ester bond, an ether bond or a hydroxyl group. $Z^2$ is a single bond, —$Z^{21}$—C(=O)—O—, —$Z^{21}$—O— or —$Z^{21}$—O—C(=O)—, $Z^{21}$ is an alkanediyl group having 1 to 12 carbon atoms, and may contain a carbonyl group, an ester bond or an ether bond. $R^2$ to $R^3$ are each independently a monovalent hydrocarbon group having 1 to 20 carbon atoms which may contain a hetero atom(s). $R^5$ is a hydrogen atom or a trifluoromethyl group. $Z^3$ is a single bond, a methylene group, an ethylene group, a phenylene group, a fluorinated phenylene group, —O—$Z^{31}$—, —C(=O)—O—$Z^{31}$— or —C(=O)—NH—$Z^{31}$—, $Z^{31}$ is an alkylene group having 1 to 6 carbon atoms, a phenylene group, a fluorinated phenylene group, a phenylene group substituted with a trifluoromethyl group, or a linear, branched or cyclic alkenylene group having 2 to 6 carbon atoms, each of which may contain a carbonyl group, an ester bond, an ether bond or a hydroxyl group. Also, $M^{1+}$ represents a counter cation having a substituent(s), and represents a sulfonium cation, an iodonium cation or an ammonium cation. $M^{0-}$ is a non-nucleophilic counter ion.

As the monomer which provides the repeating units (p-1), (p-2) and (p-3), for example, those described at the paragraphs [0068] to [0081] of JP 2018-60069A may be mentioned.

As the non-nucleophilic counter ion $M^{0-}$, there may be mentioned, for example, a halide ion such as a chloride ion, a bromide ion, etc., a fluoroalkylsulfonate such as triflate, 1,1,1-trifluoroethanesulfonate, nonafluorobutanesulfonate, etc., an arylsulfonate such as tosylate, benzenesulfonate, 4-fluorobenzenesulfonate, 1,2,3,4,5-pentafluorobenzenesulfonate, etc., an alkylsulfonate such as mesylate, butanesulfonate, etc., a sulfoneimide such as bis(trifluoromethylsulfonyl)imide, bis(perfluoroethylsulfonyl)imide, bis(perfluorobutylsulfonyl)imide, etc., and a sulfonemethide such as tris(trifluoromethylsulfonyl)-methide, tris(perfluoroethylsulfonyl)methide, etc.

As the sulfonium cation of $M^{1+}$, the materials shown below may be mentioned but it is not limited by these. In the following formulae, Me is a methyl group, nBu is an n-butyl group and tBu is a tert-butyl group.

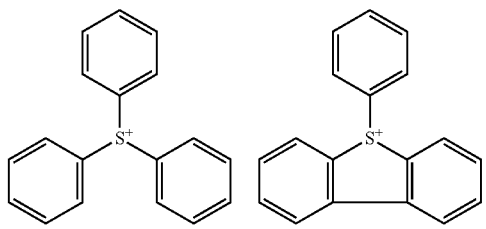

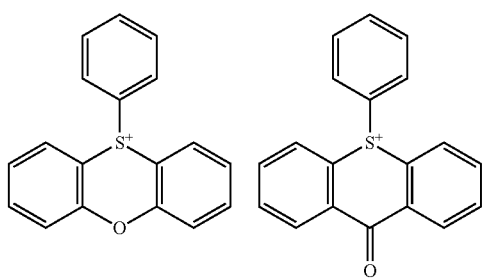

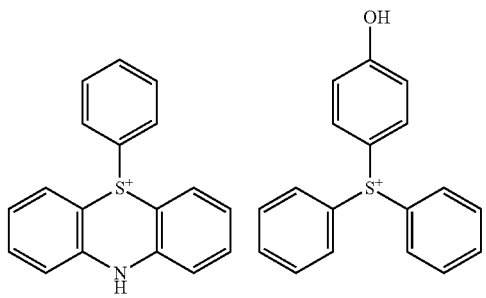

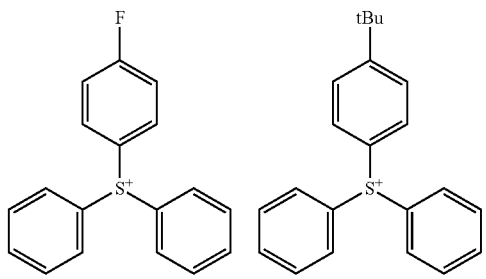

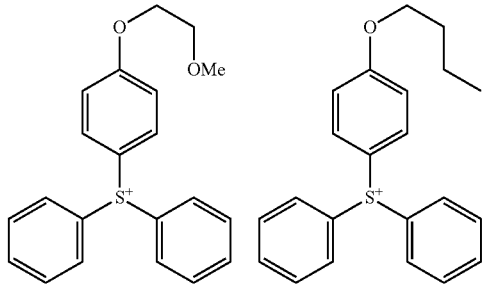

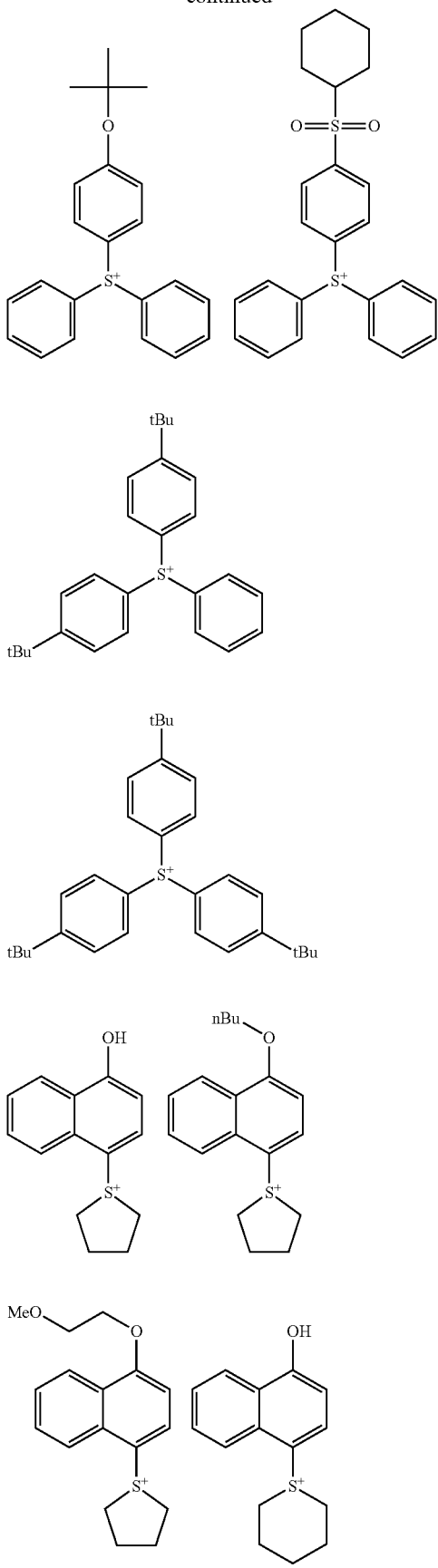
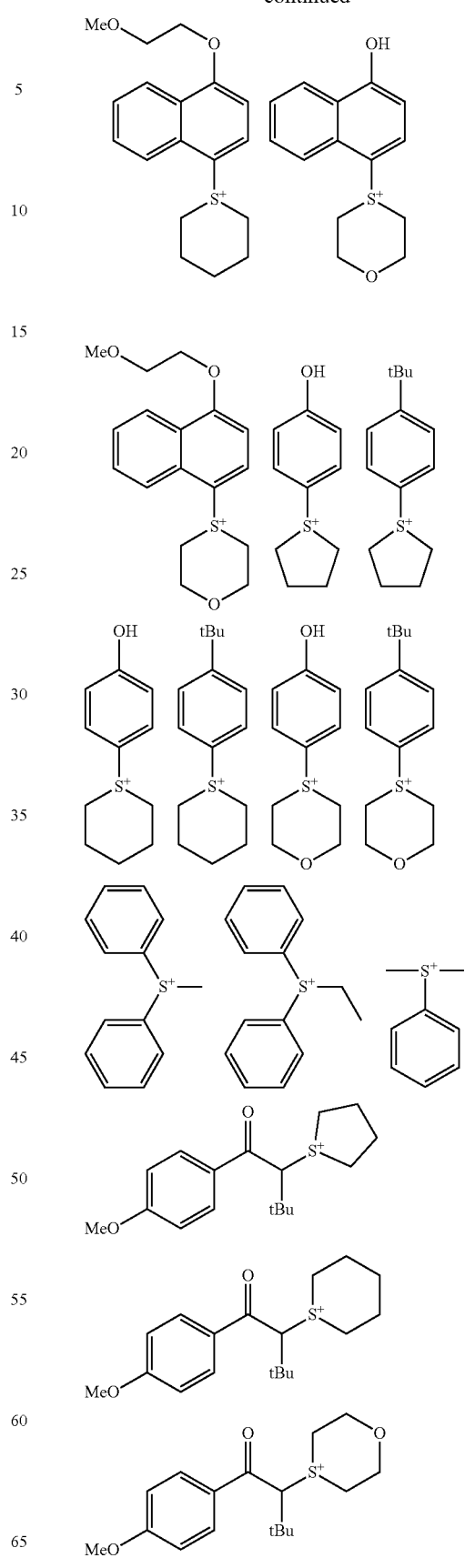

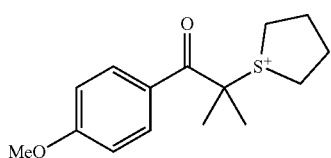
As the iodonium cation of $M^{1+}$, those shown below may be mentioned, but the invention is not limited to these. In the following formulae, tBu is a tert-butyl group and Ph is a phenyl group.
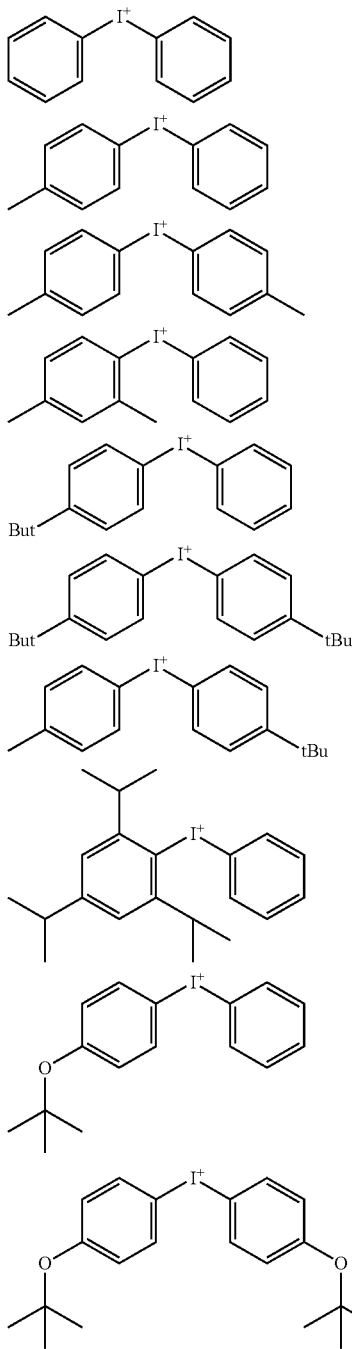
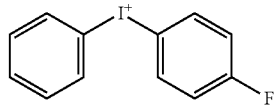
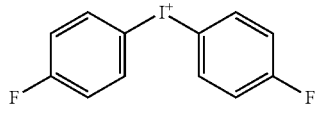
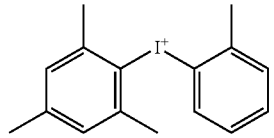
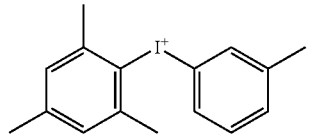
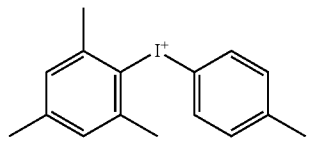
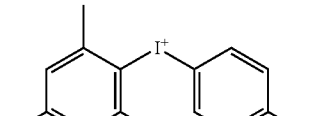
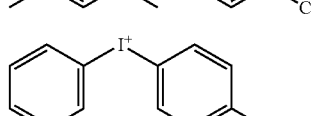
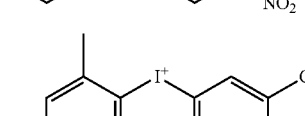
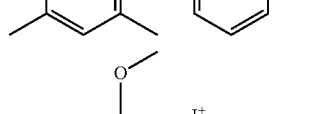
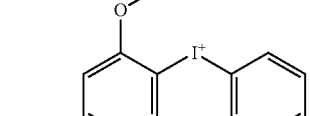
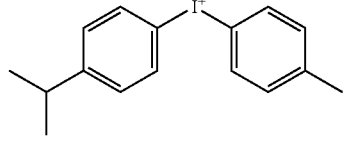
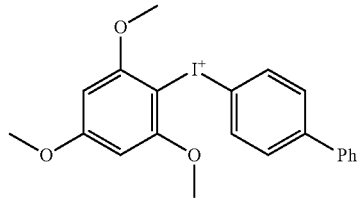

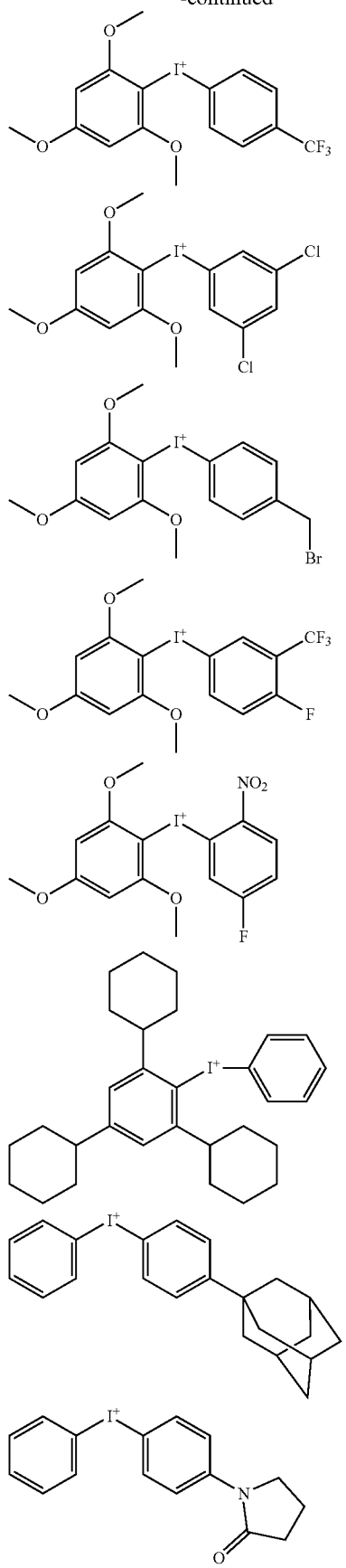
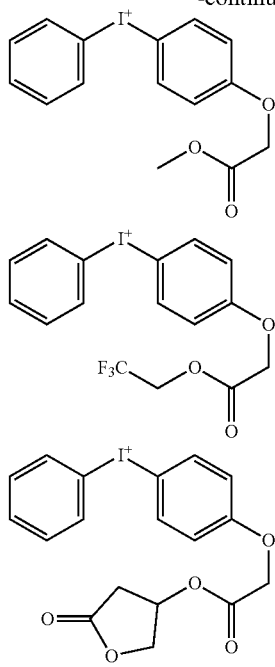
Specific examples of the ammonium cation of $M^{1+}$ may be mentioned those shown below, but the invention is not limited to these.
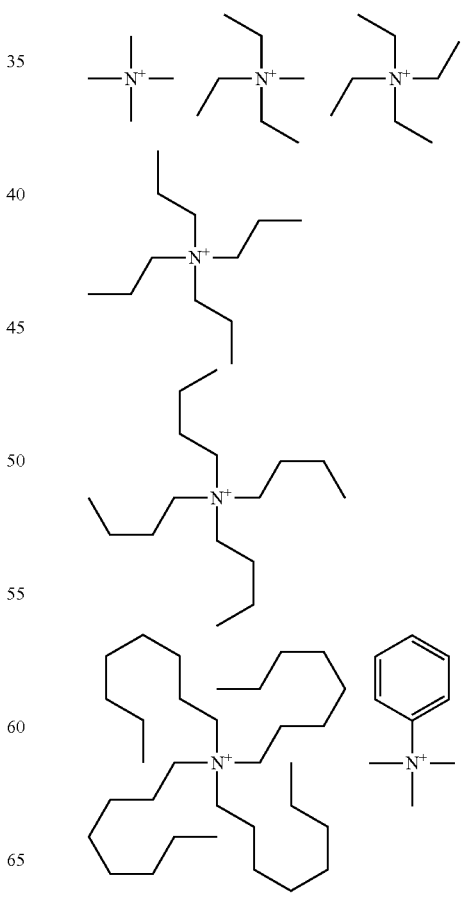

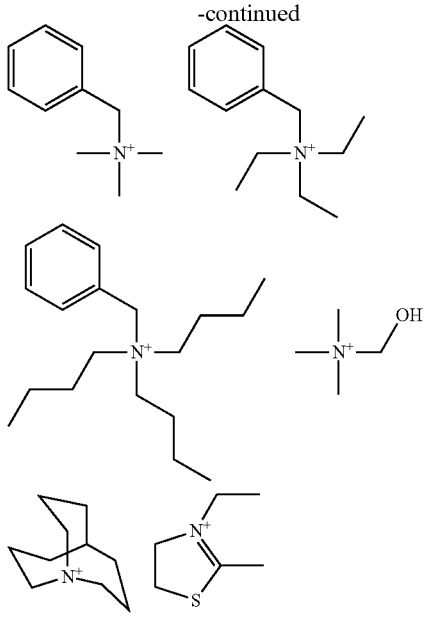

When the sum of the total composition ratio of the polymer compound is made 1, compositional ratios (ratios of the repeating units) of the repeating units (p-1), (p-2) and (p-3) are in the range of 0≤(p-1)≤0.3, 0≤(p-2)≤0.3, 0≤(p-3) ≤0.3 and 0≤(p-1)+(p-2)+(p-2)≤0.3.

By binding an acid generator to the polymer main chain, acid diffusion can be reduced, and lowering in resolution due to blurring with the acid diffusion can be prevented. In addition, by the acid generator being uniformly dispersed, edge roughness (LER and LWR) is improved.

[Repeating Unit (a-1)]

The polymer compound constituting the resist composition of the present invention has a repeating unit containing a structure in which a polarity thereof changes by an action of an acid, represented by the following general formula (a-1).

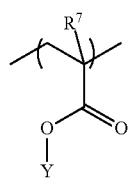

(a-1)

In the above-mentioned formula (a-1), $R^7$ is a hydrogen atom or a methyl group. Y has a structure in which a polarity changes by an action of an acid to become soluble in an aqueous alkali solution.

A difference (ΔC log P) between a C log P of the repeating unit (a-1) and a C log P of the repeating unit (a-1) after changing the polarity by an action of an acid is 3.0 to 4.5.

If the ΔC log P of the formula (a-1) is higher than 4.5, the compound released by an action of an acid is bulky, so that the solubility in an alkali developing solution is low, and clogging of the hole pattern and T-top shape in the line pattern are generated. If the ΔC log P is lower than 3.0, the height of the resist film is easily decreased, and in the line pattern, pattern collapse is easily caused and depth of focus becomes narrow.

Specific examples of the monomer which gives the repeating unit (a-1) may be mentioned those shown below, but the invention is not limited to these.

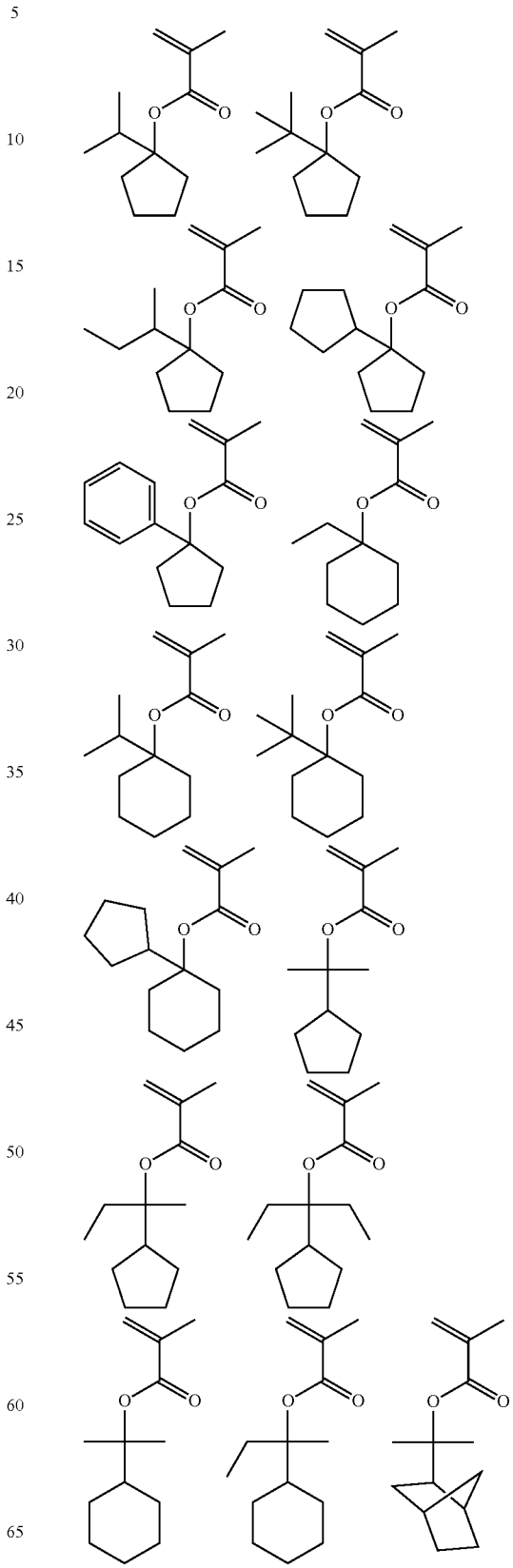

-continued

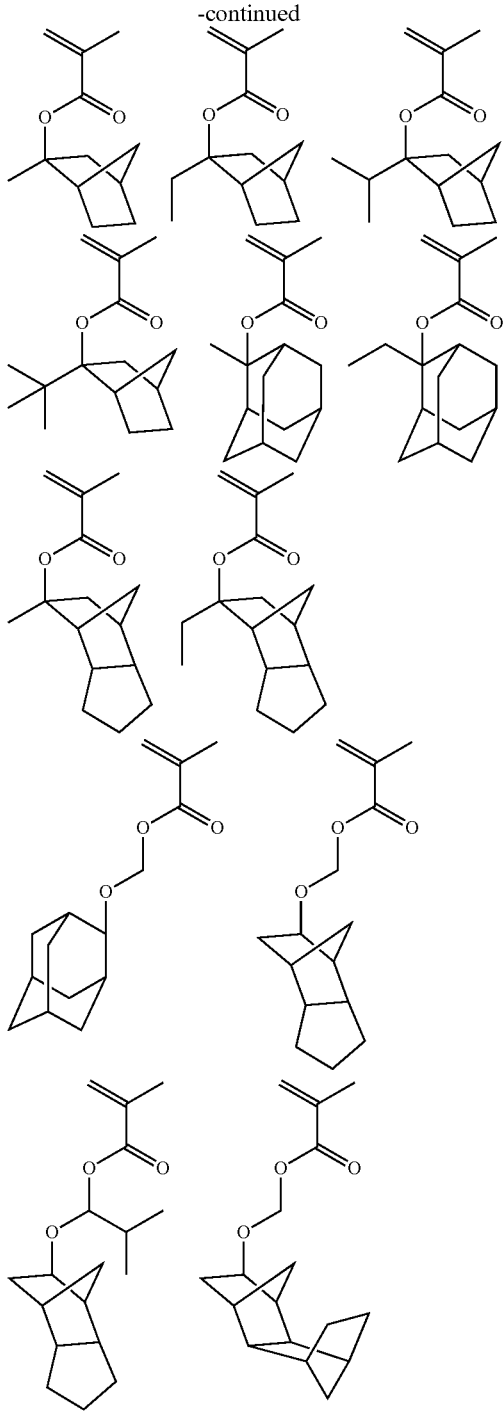

The difference of a C log P between the formulae (a-1) and (a-1) after changing the polarity thereof by an action of an acid is preferably in the range of 3.3 to 4.2.

The C log P value is confirmed by using a software of ChemDraw Ultra (Registered Trademark) available from Cambridge Soft Corporation. In order to reproduce the state at the time of introducing the polymer, calculation was carried out in the state that the polymerizable group of the above-mentioned monomer is reduced.

[Repeating Unit (a-2)]

The polymer compound constituting the resist composition of the present invention has the repeating unit contain-ing a structure in which a polarity changes by an action of an acid represented by the following general formula (a-2).

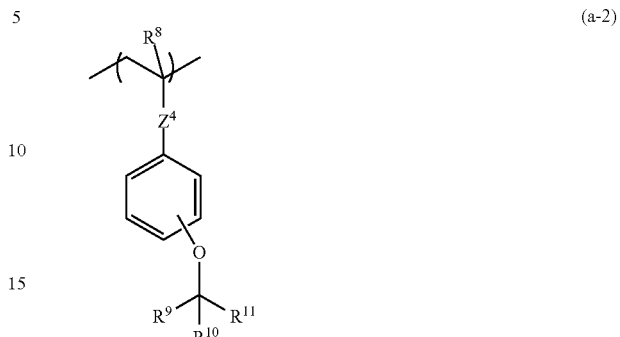

In the formula (a-2), $R^8$ is a hydrogen atom or a methyl group. $Z^4$ is a single bond, a methylene group, an ethylene group, a phenylene group, a fluorinated phenylene group, $-O-Z^{41}-$, $-C(=O)-O-Z^{41}-$ or $-C(=O)-NH-Z^{41}-$, $Z^{41}$ is an alkanediyl group having 1 to 12 carbon atoms, and may contain a carbonyl group, an ester bond or an ether bond. $R^9$ to $R^{11}$ each independently represent a hydrocarbon group which is linear having 1 to 10 carbon atoms, or branched or cyclic having 3 to 10 carbon atoms, and among two of them may be bonded to each other to form a ring.

In addition, the repeating unit represented by the above-mentioned formula (a-2) can be a repeating unit represented by the following formula (a-2-1).

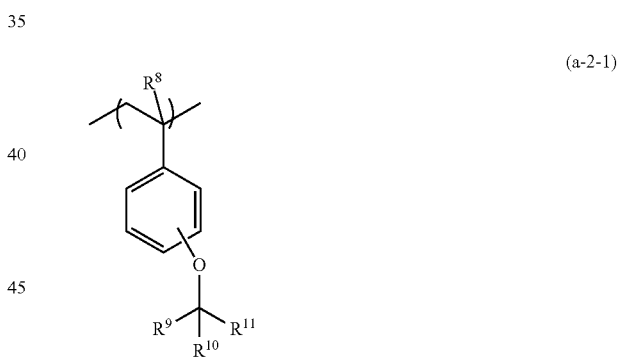

(In the formula (a-2-1), $R^8$ to $R^{11}$ are as defined above.)

The difference ($\Delta$C log P) between a C log P of the repeating unit (a-2) and a C log P of the repeating unit (a-2) after changing the polarity thereof by an action of an acid is 2.5 to 3.2.

The repeating unit represented by (a-2) is inferior in acid dissociation property as compared with that of the repeating unit represented by (a-1) so that it is inferior in dissolution contrast, but it suppresses swelling to the alkali developing solution, prevents pattern collapse and broadens depth of focus. If $\Delta$C log P is out of the range of 2.5 to 3.2, it is impossible to take a balance between dissolution-preventing property into a developing solution and suppression of swelling after elimination.

Specific examples of the monomer which gives the repeating unit (a-2) may be mentioned those shown below, but the invention is not limited to these.

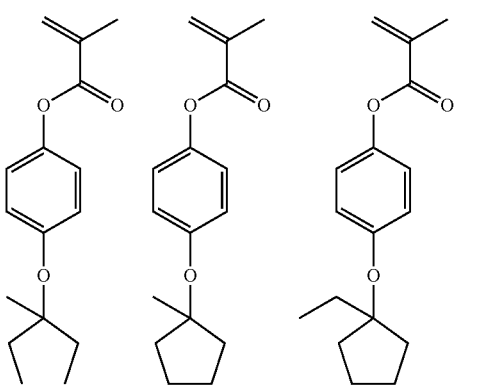
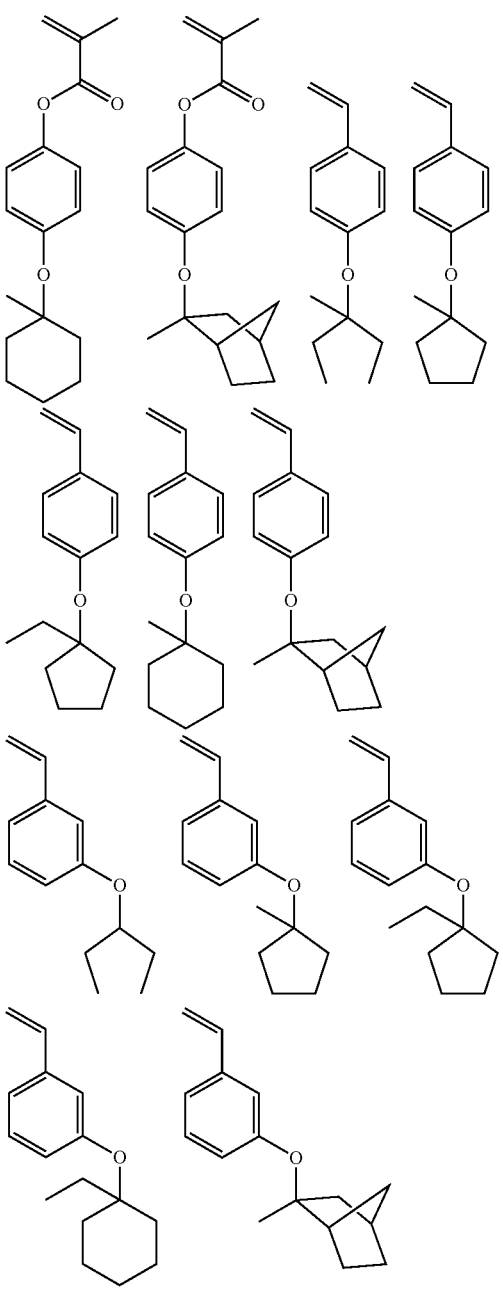

[Repeating Unit (b-1)]

The polymer compound constituting the resist composition of the present invention has the following general formula (b-1).

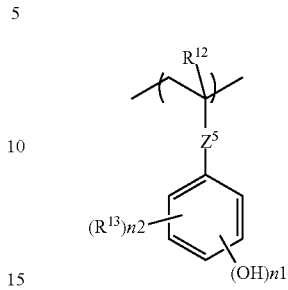

In the formula (b-1), $R^{12}$ is a hydrogen atom or a methyl group. $Z^5$ is a single bond, a methylene group, an ethylene group, a phenylene group, a fluorinated phenylene group, —O—$Z^{51}$—, —C(=O)—O—$Z^{51}$— or —C(=O)—NH—$Z^{51}$—, $Z^{51}$ is an alkanediyl group having 1 to 12 carbon atoms, and may contain a carbonyl group, an ester bond or an ether bond. n1 is an integer of 1 to 3, n2 is an integer of 0 to 3 and a sum of n1 and n2 is 5 or less. $R^{13}$ is a halogen atom or a hydrocarbon group which is linear having 1 to 10 carbon atoms, or branched or cyclic having 3 to 10 carbon atoms, —$CH_2$— constituting the hydrocarbon group may be replaced by —O—, —C(=O)—O— or —C(=O)—, or a hydrogen atom constituting the hydrocarbon group may be substituted with a halogen atom or a hetero atom.

Specific examples of the monomer which gives the repeating unit (b-1) may be mentioned those shown below, but the invention is not limited to these.

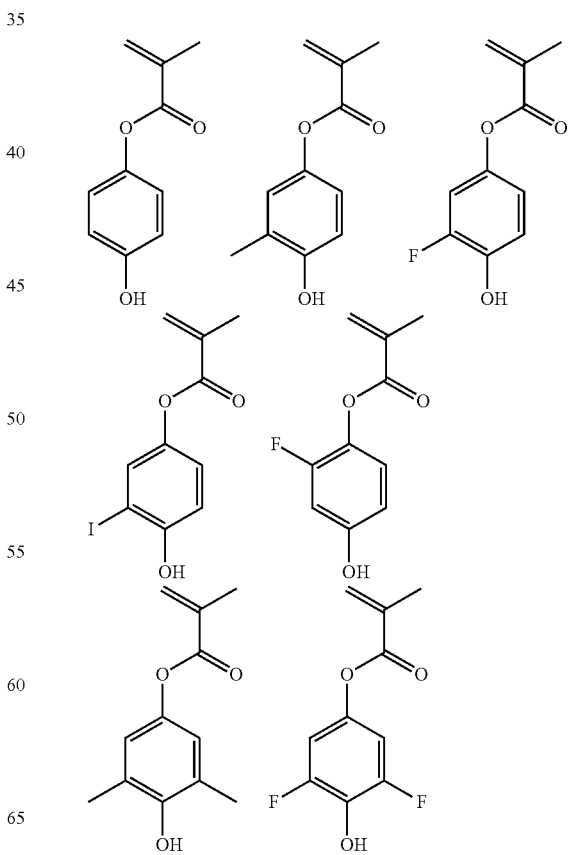

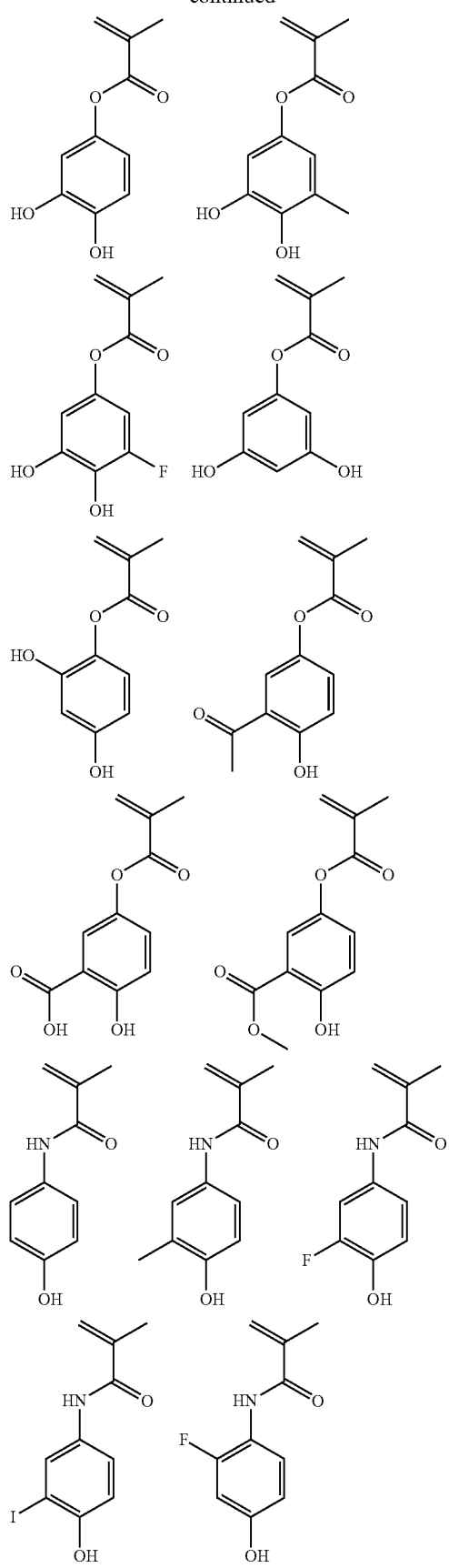
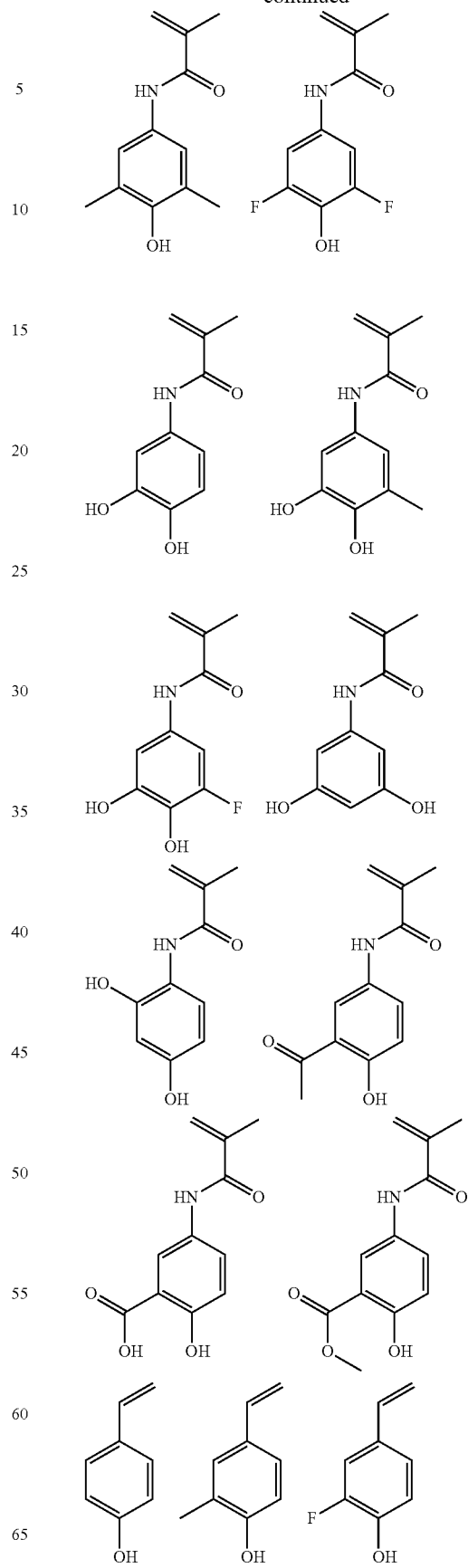

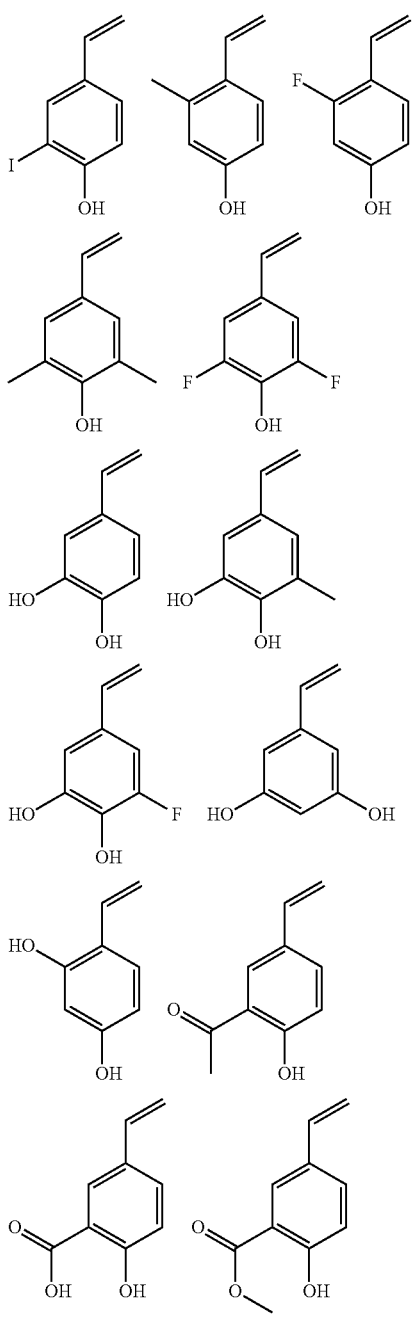

The compound containing a phenolic hydroxyl group has a sensitization effect, and is excellent in sensitivity and CDU.

[Repeating Unit (c-1)]

The above-mentioned polymer compound may contain the repeating unit having a lactone structure represented by the following general formula (c-1).

(In the following formula (c-1), $R^{14}$ is a hydrogen atom or a methyl group. $X^1$ is a single bond or a hydrocarbon group having 1 to 5 carbon atoms and —CH$_2$-constituting the hydrocarbon group may be replaced by —O—, —C(=O)—O— or —C(=O)—. L is a group having a lactone structure.)

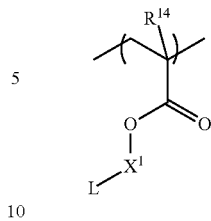

(c-1)

L in the above-mentioned formula (c-1) can be any of the group represented by the following formulae (c-1-1), (c-1-2) and (c-1-3).

L =

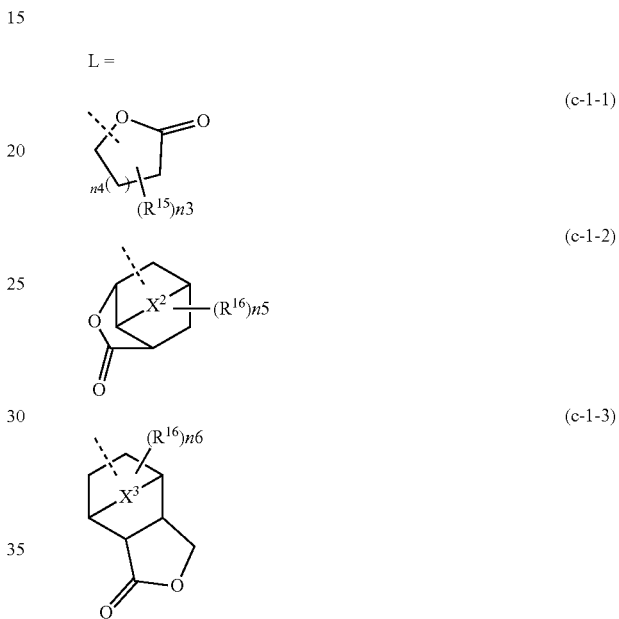

(c-1-1)

(c-1-2)

(c-1-3)

In the formula (c-1-1), n3 is an integer of 1 to 4, $R^{15}$ is a hydrocarbon group which is linear having 1 to 10 carbon atoms, or branched or cyclic having 3 to 10 carbon atoms, —CH$_2$— constituting the hydrocarbon group may be replaced by —O—, —C(=O)—O— or —C(=O)—, or a hydrogen atom constituting the hydrocarbon group may be substituted with a halogen atom or a hetero atom. n4 represents a linking group having 1 to 5 carbon atoms. In the formula (c-1-2), $X^2$ is a single bond or a hydrocarbon group having 1 to 5 carbon atoms and —CH$_2$— constituting the hydrocarbon group may be replaced by —O— or —C(=O)—. n5 is an integer of 1 to 4, $R^{16}$ is a hydrocarbon group which is linear having 1 to 10 carbon atoms, or branched or cyclic having 3 to 10 carbon atoms, —CH$_2$— constituting the hydrocarbon group may be replaced by —O—, —C(=O)—O— or —C(=O)—, or a hydrogen atom constituting the hydrocarbon group may be substituted with a halogen atom or a hetero atom. In the formula (c-1-3), $X^3$ is a single bond or a hydrocarbon group having 1 to 5 carbon atoms and —CH$_2$-constituting the hydrocarbon group may be replaced by —O— or —C(=O)—. n6 is an integer of 1 to 4, $R^{17}$ is a hydrocarbon group which is linear having 1 to 10 carbon atoms, or branched or cyclic having 3 to 10 carbon atoms, —CH$_2$— constituting the hydrocarbon group may be replaced by —O—, —C(=O)—O— or —C(=O)—, or a hydrogen atom constituting the hydrocarbon group may be substituted with a halogen atom or a hetero atom.

As the structure of the formula (c-1-1), specific examples are mentioned below, but the invention is not limited to these. The dotted line is a binding arm.

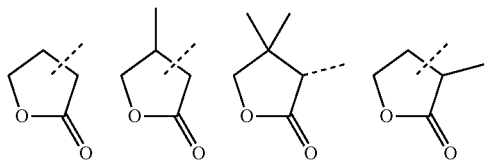

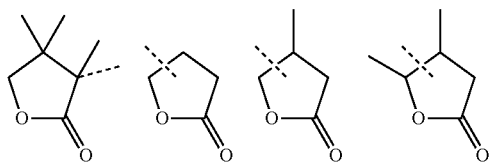

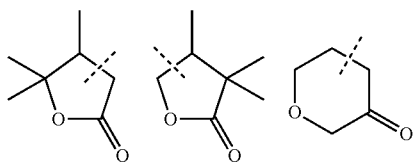

As the structure of the formula (c-1-2), specific examples are mentioned below, but the invention is not limited to these. The dotted line is a binding arm.

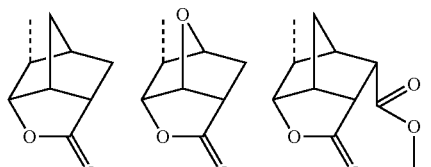

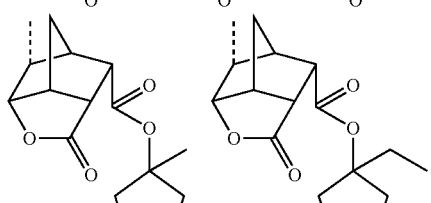

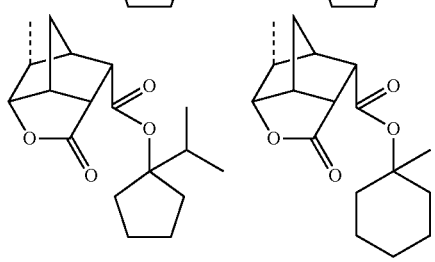

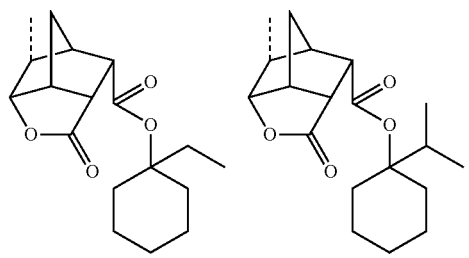

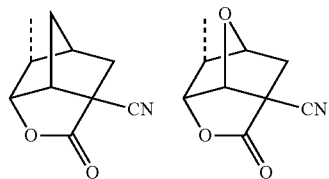

As the structure of the formula (c-1-3), specific examples are mentioned below, but the invention is not limited to these. The dotted line is a binding arm.

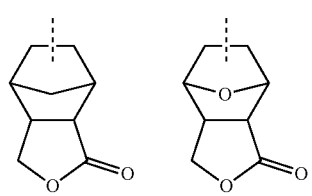

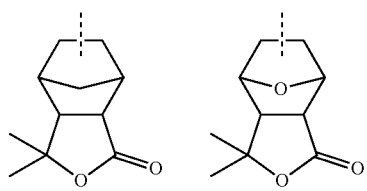

As the repeating unit of (c-1), specific examples are mentioned below, but the invention is not limited to these.

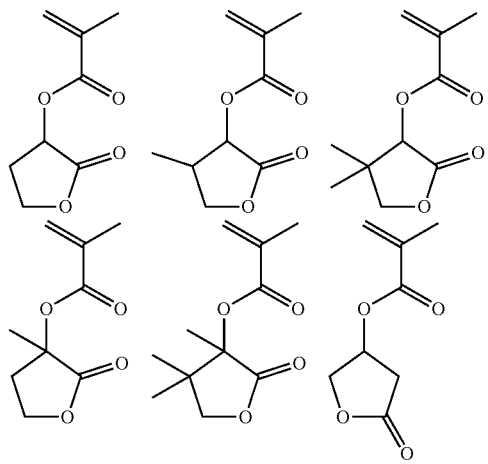

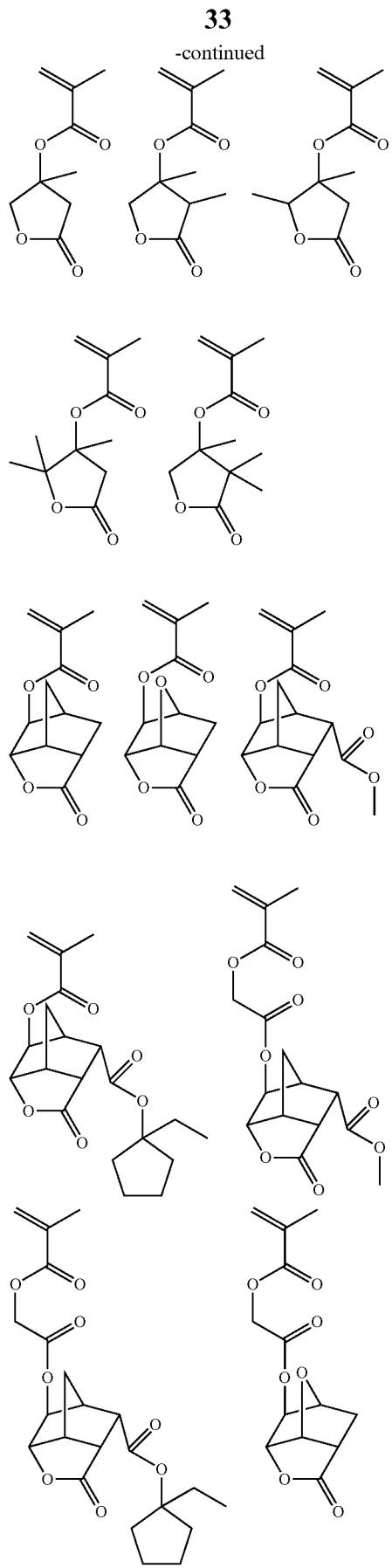

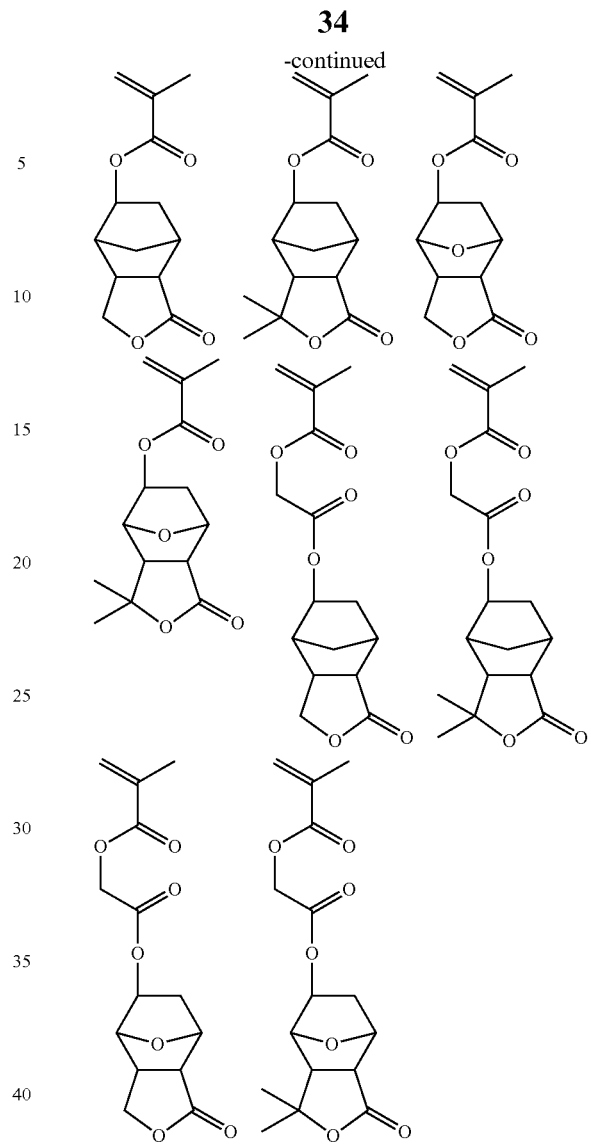

The resist composition of the present invention contains a salt represented by the following formula (B).

$$Ma\text{-}CO_2^- M^{2+} \quad (B)$$

In the formula (B), Ma represents a linear, branched or cyclic monovalent hydrocarbon group having 1 to 35 carbon atoms which may contain an oxygen atom(s). Also, one or more hydrogen atoms bonded to the carbon atom may be substituted with a fluorine atom(s); and $M^{2+}$ represents a counter cation having a substituent(s), and is a sulfonium cation, an iodonium cation or an ammonium cation.

In addition, the salt represented by the above-mentioned general formula (B) can be a salt represented by the following formula (B1).

(B1)

(In the formula (B1), $R^{18}$ to $R^{19}$ each independently represent a hydrogen atom, a fluorine atom or a trifluoromethyl group. $R^{20}$ represents a hydrogen atom, a hydroxyl group, a linear, branched or cyclic, substituted or unsubstituted alkyl group having 1 to 20 carbon atoms, or a substituted or unsubstituted aryl group having 6 to 30 carbon atoms; and $M^{2+}$ is the same as defined above.)

Specific examples of the anionic structure ($Ma\text{-}CO_2^-$) of the formula (B); and the anionic structure of the formula (B1) may be mentioned those shown below, but the invention is not limited to these.

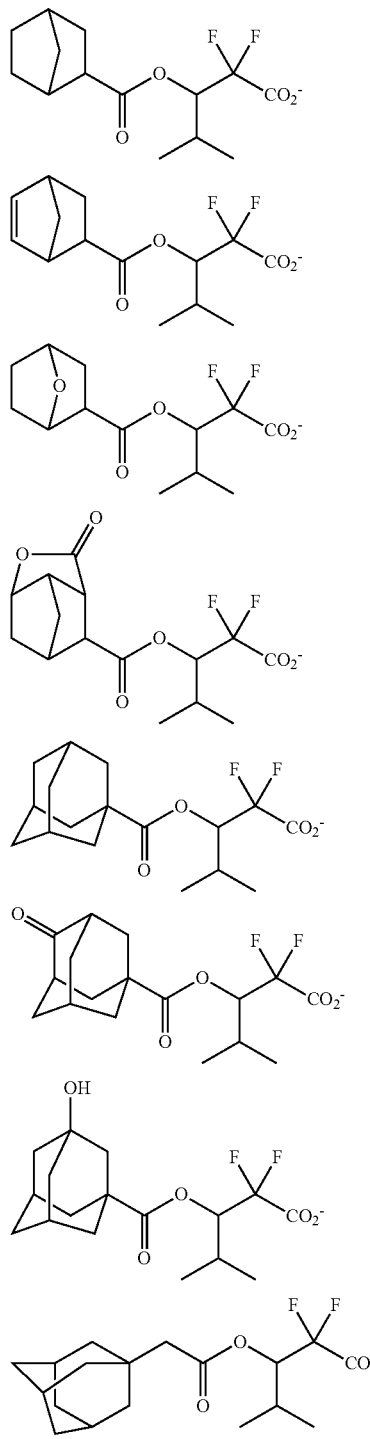

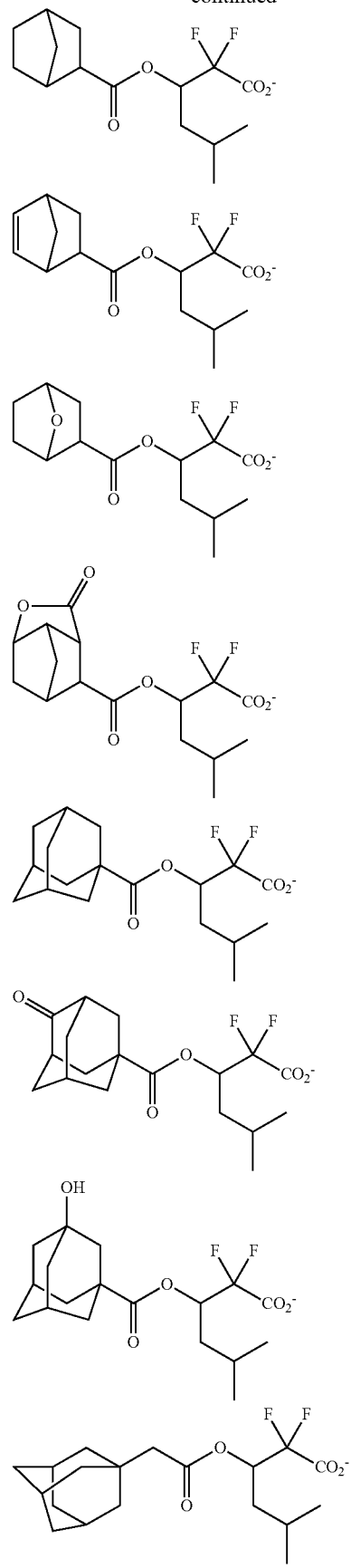

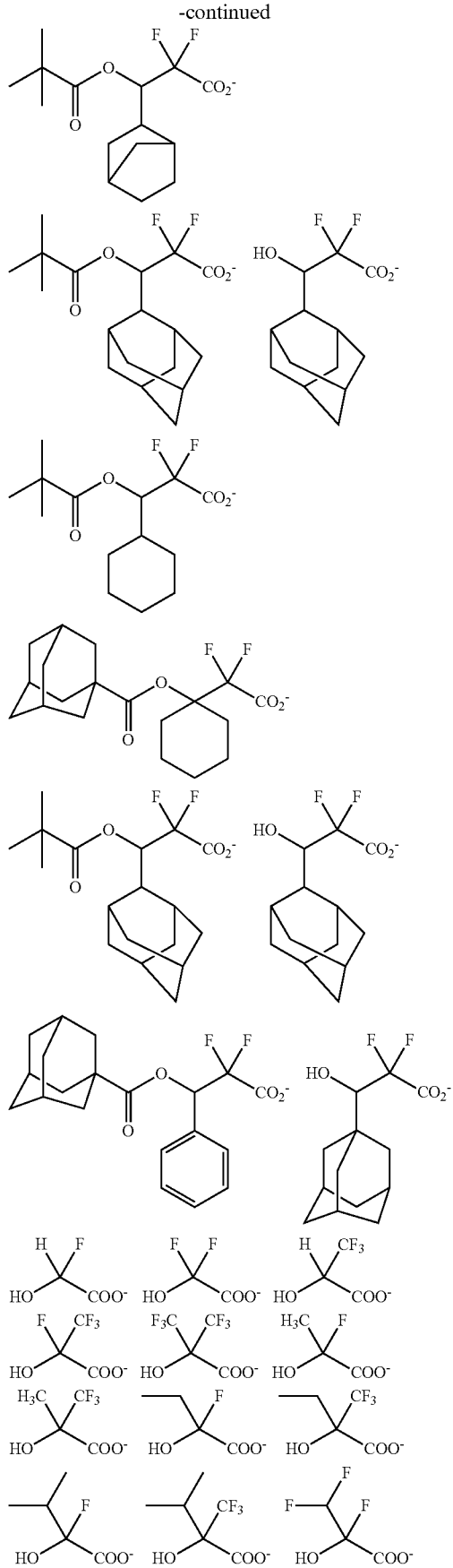

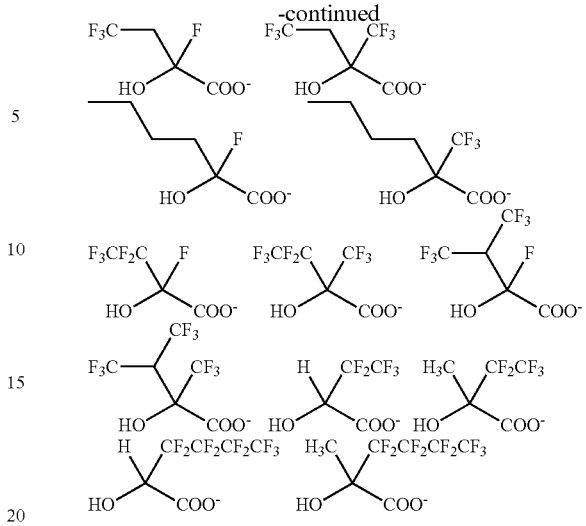

The sulfonium salt, the iodonium salt and the ammonium salt as the cationic structure $M^{2+}$ of the above-mentioned formula (B) can be shown by the structures similar to the above, but the invention is not limited to these.

An amount of these salts (B) to be added is more than 0 and 40 parts by mass or less based on 100 parts by mass of the base resin in the resist composition, preferably 0.1 to 40 parts by mass, and further preferably 0.1 to 20 parts by mass. If it is within the above-mentioned range, there is no fear of causing deterioration of resolution, or the problem of foreign matter after developing the resist or at the time of peeling.

The carboxylic acid has lower acid strength as compared with the sulfonium salt which generates an alkane sulfonic acid in which the α-position of the sulfonic acid has been substituted with a fluorine atom or an alkane sulfonic acid in which the α-position of the sulfonic acid has not been substituted with fluorine atom. Therefore, the cation of the carboxylic acid undergoes, for example, salt exchange with an alkane sulfonic acid substituted with a fluorine atom at the α-position which is contained in the polymer compound such as a polymer compound having the repeating unit (p-2), so that it works like a quencher. A carboxylic acid having lower acid strength has a large quenching ability and contrast is increased, so that it is excellent in rectangularity of the pattern after development or edge roughness.

The resist composition of the present invention may further contain a salt represented by the following formula (B2).

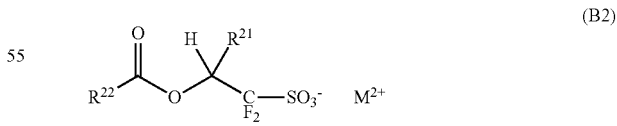

(B2)

In the formula (B2), $R^{21}$ represents a hydrogen atom or a trifluoromethyl group. $R^{22}$ represents a linear, branched or cyclic monovalent hydrocarbon group having 1 to 35 carbon atoms which may contain an oxygen atom(s). Also, one or more hydrogen atoms bonded to the carbon atom may be substituted with a fluorine atom(s). $M^{2+}$ represents a counter cation having a substituent(s), and represents a sulfonium cation, an iodonium cation or an ammonium cation.

Specific examples of the anionic structure of the formula (B2) may be mentioned those shown below, but the invention is not limited to these.
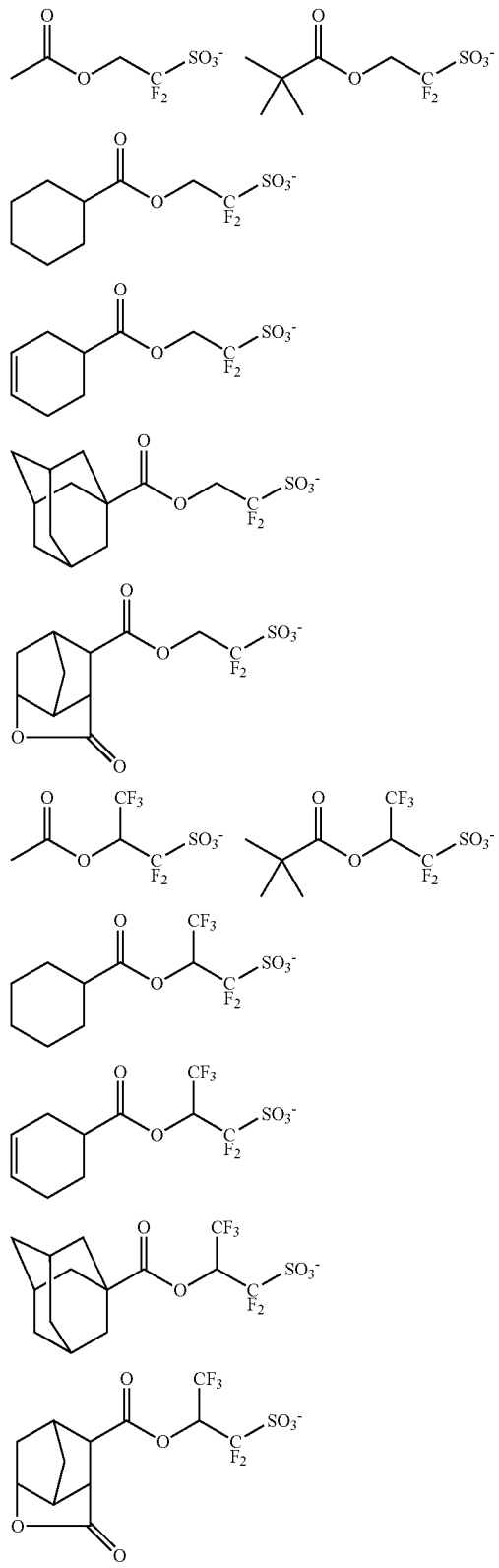
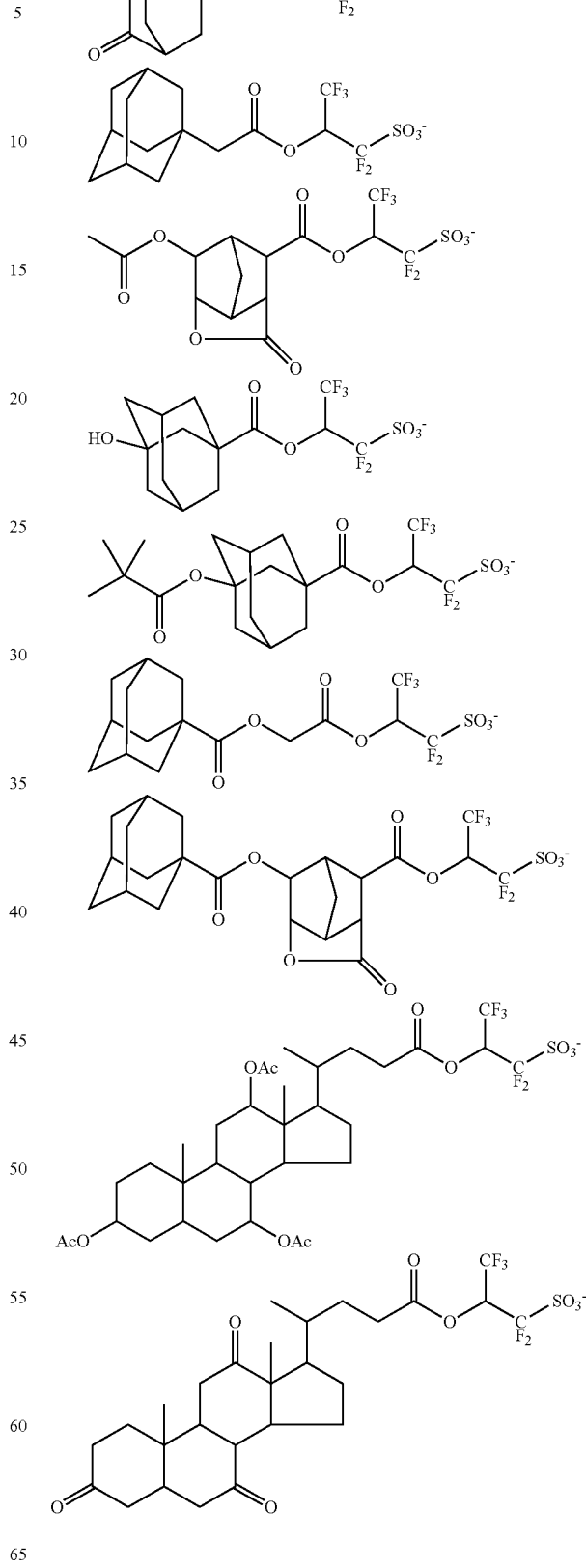
The sulfonium salt, the iodonium salt and the ammonium salt as the specific examples of the cationic structure M²⁺ of the above-mentioned formula (B2) may be mentioned those having the similar structure as mentioned above, but the invention is not limited to these.

An amount of these salts (B2) to be added is 0 to 40 parts by mass based on 100 parts by mass of the base resin in the resist composition, and when it is formulated, it is preferably 0.1 to 40 parts by mass, and further preferably 0.1 to 20 parts by mass. If it is within the above-mentioned range, there is no fear of causing deterioration of resolution, or the problem of foreign matter after developing the resist or at the time of peeling.

[Solvent]

The solvent to be used in the present invention may be any organic solvent as long as it can dissolve the polymer compound, a photoacid generator, a quencher, other additives, etc. Such an organic solvent may be mentioned, for example, as described at the paragraphs [0144] to [0145] of JP 2008-111103A, ketones such as cyclohexanone, methyl-2-n-amylketone, etc., alcohols such as 3-methoxybutanol, 3-methyl-3-methoxybutanol, 1-methoxy-2-propanol, 1-ethoxy-2-propanol, etc., ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, etc., esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, etc., lactones such as γ-butyrolactone, etc., and a mixed solvent thereof. When an acetal-based acid labile group is used, in order to accelerate deprotection reaction of the acetal, a high boiling point alcohol-based solvent, specifically, diethylene glycol, propylene glycol, glycerin, 1,4-butanediol, 1,3-butanediol, etc., may be added.

In the present invention, among these organic solvents, 1-ethoxy-2-propanol, propylene glycol monomethyl ether acetate, cyclohexanone, γ-butyrolactone, 4-hydroxy-4-methyl-2-pentanone and a mixed solvent thereof, which are particularly excellent in solubility of the acid generator in the resist components are preferably used.

An amount of the organic solvent to be used is suitably 200 to 12,000 parts by mass, particularly 1,000 to 7,000 parts by mass based on 100 parts by mass of the base resin.

[Other Components]

The resist composition of the present invention may contain a quencher (nitrogen-containing compound), a surfactant, etc., if necessary.

(Nitrogen-Containing Compound)

In the present invention, a nitrogen-containing compound may be added as a quencher. By adding this material, it is possible to suppress the diffusion rate of the acid generated from the photoacid generator when it is diffused in the resist film. As such a nitrogen-containing compound, there may be mentioned a primary, secondary or tertiary amine compound described at the paragraphs [0146] to [0164] of JP 2008-111103A, in particular, an amine compound having a hydroxyl group, an ether bond, an ester bond, a lactone ring, a cyano group and/or a sulfonate bond may be mentioned. In addition, as in the compound described in Japanese Patent No. 3,790,649, a compound in which a primary or secondary amine is protected as a carbamate group may be also mentioned.

These quenchers can be used a single kind alone or two or more kinds in combination, and a formulation amount thereof is preferably 0.001 to 12 parts by mass, particularly 0.01 to 8 parts by mass based on 100 parts by mass of the base resin. By formulating the quencher, in addition to facilitating adjustment of sensitivity of the resist, a diffusion rate of the acid in the resist film is suppressed to improve resolution, change in sensitivity after exposure is suppressed, the dependence on a substrate or an environment is reduced, and exposure margin, pattern profile, etc., can be improved. In addition, by adding these quenchers, adhesiveness of the substrate can be also improved.

In addition, a photoacid generator having a nitrogen-containing substituent may be used in combination. Such a compound functions as a quencher in a non-exposed area, and functions as a photodegradable base that loses the ability of quenching by neutralization with an acid generated from itself in an exposed area. The use of the photodegradable base allows for sharper contrast between an exposed area and a non-exposed area. Illustrative example of the photodegradable base may include those in JP 2009-109595A, JP 2012-046501A, etc.

(Surfactant)

To the resist composition of the present invention, a surfactant may be added. As the surfactant, there may be mentioned a surfactant which is insoluble or difficultly soluble in water and soluble in an alkali developing solution, and/or a surfactant (hydrophobic resin) which is insoluble or difficultly soluble in water and an alkali developing solution and, for example, it can be referred to the (S) definition components described in JP 2010-215608A or JP 2011-16746A.

As the surfactant insoluble or difficultly soluble in water and the alkali developing solution, among the surfactants described in the above-mentioned publications, FC-4430, SURFLON S-381, SURFYNOL E1004, KH-20, KH-30, and an oxetane ring-opening polymerized product represented by the following structural formula (surf-1) are suitable. These may be used singly or two or more kinds in combination.

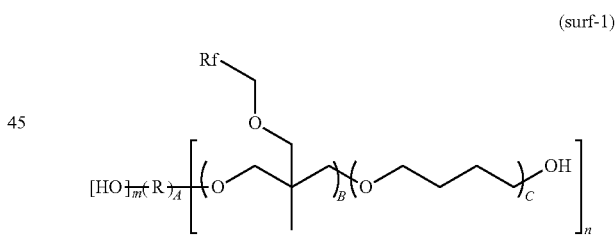

(surf-1)

Here, R, Rf, A, B, C, "m" and "n" are applied only to the above-mentioned formula (surf-1) regardless of the above-mentioned description. R represents a divalent to tetravalent aliphatic group having 2 to 5 carbon atoms, specifically the divalent group may be mentioned ethylene, 1,4-butylene, 1,2-propylene, 2,2-dimethyl-1,3-propylene and 1,5-pentylene, and the trivalent or tetravalent group may be mentioned the following.

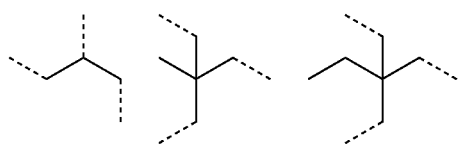

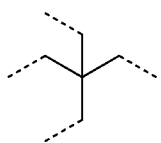

(wherein, the dotted line represents a bonding arm, and each is a partial structure derived from glycerol, trimethylolethane, trimethylolpropane and pentaerythritol, respectively.)

Among these, preferably used is 1,4-butylene or 2,2-dimethyl-1,3-propylene. Rf represents a trifluoromethyl group or a pentafluoroethyl group, and preferably a trifluoromethyl group. "m" is an integer of 0 to 3, "n" is an integer of 1 to 4, and the sum of "n" and "m" represents the valence number of R and is an integer of 2 to 4. A is 1, B is an integer of 2 to 25, and C is an integer of 0 to 10. Preferably B is an integer of 4 to 20, and C is 0 or 1. In addition, the respective structural units of the above-mentioned structures do not define the arrangement thereof, and may be bonded in block or random. For the manufacture of partially fluorinated oxetane ring-opening polymer-based surfactants, it is described in U.S. Pat. No. 5,650,483, etc., in detail.

The surfactant which is insoluble or difficultly soluble in water and soluble in an alkali developing solution has a function of reducing penetration of water and leaching by orientation on the surface of the resist after spin coating when a resist protective film is not used in ArF immersion exposure. Therefore, it is useful for suppressing elution of the water-soluble components from the resist film and reducing damage to the exposure apparatus, and after exposure, it is useful since it becomes soluble at the time of alkali development after post-exposure baking (PEB), and it difficultly become a foreign matter which causes defects. Such a surfactant has characteristics of insoluble or difficultly soluble in water and soluble in an alkali developing solution, is a polymer type surfactant and is also called a hydrophobic resin. It can improve solubility of the difficultly soluble surface layer even with dry exposure, so that defects can be reduced. In particular, a material which improves solubility in an alkali developing solution is preferable.

Such a polymer type surfactant may be mentioned a polymer compound having repeating units represented by the general formulae (a'-1), (a'-2), (a'-3), b' and c' mentioned below, and the like.

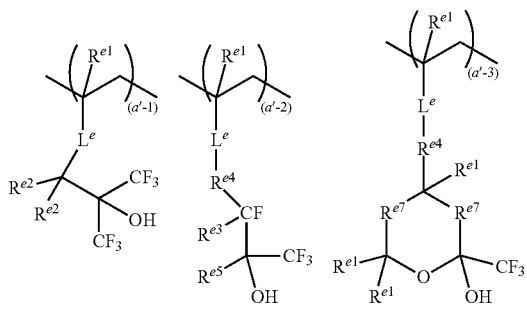

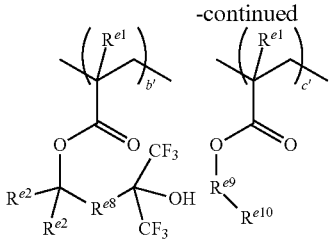

In the formulae, $R^{e1}$ are each independently a hydrogen atom, a fluorine atom, a methyl group or a trifluoromethyl group. $R^{e2}$ are each independently a hydrogen atom, or a linear, branched or cyclic alkyl group or fluorinated alkyl group having 1 to 20 carbon atoms, and $R^{e2}$ in the same repeating unit may be bonded to each other to form a ring together with the carbon atom to which these are bonded, and in this case, it is a linear, branched or cyclic alkylene group or fluorinated alkylene group having 2 to 20 carbon atoms in total.

$R^{e3}$ is a hydrogen atom or a fluorine atom, or may be bonded to $R^{e4}$ to form a non-aromatic ring having 3 to 10 carbon atoms together with the carbon atom to which these are bonded. $R^{e4}$ is a linear, branched or cyclic alkylene group having 1 to 6 carbon atoms, and one or more hydrogen atoms may be replaced with a fluorine atom(s). $R^{e5}$ is a linear or branched alkyl group having 1 to 10 carbon atoms in which one or more hydrogen atoms are replaced with a fluorine atom(s), and $R^{e4}$ and $R^{e5}$ are bonded to form a non-aromatic ring together with the carbon atom to which these are bonded, and in this case, $R^{e4}$, $R^{e5}$ and the carbon atom to which these are bonded form a trivalent organic group having 3 to 12 carbon atoms. The above-mentioned trivalent organic group may have an ether bond in the non-aromatic ring. $R^{e6}$ is a single bond, or an alkylene group having 1 to 4 carbon atoms.

$R^{e7}$s are each independently a single bond, —O— or —$CR^{e1}R^{e1}$—. $R^{e8}$ is a linear or branched alkylene group having 1 to 4 carbon atoms, and may form a non-aromatic ring having 3 to 6 carbon atoms by bonding to $R^{e2}$ in the same repeating unit together with the carbon atom to which these are bonded. At this time, the hydrogen atom of the non-aromatic ring may be replaced with a $(CF_3)_2C(OH)$ group.

$R^{e9}$ is a methylene group, a 1,2-ethylene group, a 1,3-propylene group or a 1,4-butylene group, and may contain an ester bond. $R^{e10}$ is a linear perfluoroalkyl group having 1 to 6 carbon atoms, a 3H-perfluoropropyl group, a 4H-perfluorobutyl group, a 5H-perfluoropentyl group or a 6H-perfluorohexyl group. When $R^{e9}$ is a methylene group, one or more of the hydrogen atom(s) may be replaced with $R^{e10}$.

$L^e$ are each independently —C(=O)—O—, —O— or —C(=O)—$R^{e11}$—C(=O)—O—, and $R^{e11}$ is a linear, branched or cyclic alkylene group having 1 to 10 carbon atoms.

Also, the copolymerization ratios (molar ratio) of (a'-1), (a'-2), (a'-3), b' and c' are $0 \leq (a'-1) \leq 1$, $0 \leq (a'-2) \leq 1$, $0 \leq (a'-3) \leq 1$, $0 \leq b' \leq 1$ and $0 \leq c' \leq 1$, and $0 \leq (a'-1)+(a'-2)+(a'-3)+b'+c' \leq 1$.

Here, (a'-1)+(a'-2)+(a'-3)+b'+c'=1 means that, in the polymer compound containing the repeating units (a'-1), (a'-2), (a'-3), b' and c', the total amount of the repeating units (a'-1), (a'-2), (a'-3), b' and c' is 100 mol % based on the total amount of the whole repeating units, and (a'-1)+(a'-2)+(a'-3)+b'+c' ≤ 1 means that the total amount of the repeating units (a'-1), (a'-2), (a'-3), b' and c' is less than 100 mol % based on the total amount of the whole repeating units and other repeating unit(s) than (a'-1), (a'-2), (a'-3), b' and c' is contained.

Specific examples of the repeating units are shown below, but the invention is not limited to these. In the following formulae, $R^{e1}$ has the same meaning as defined above.

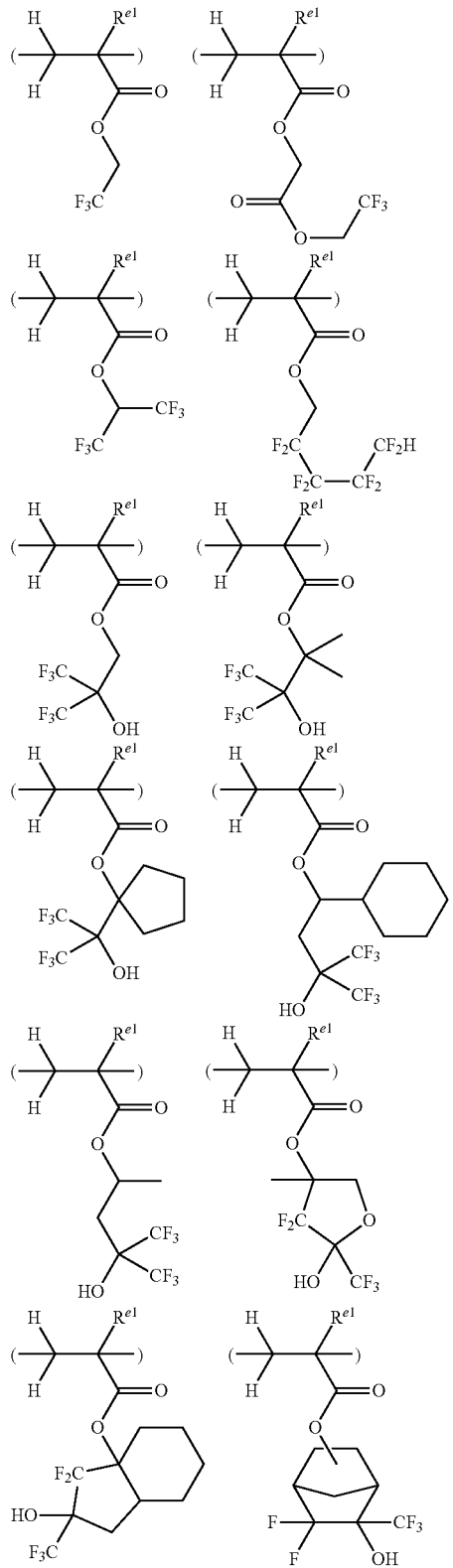

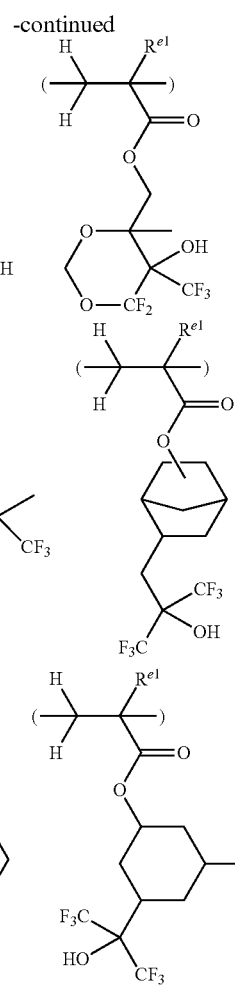

A weight average molecular weight Mw of the above-mentioned polymer type surfactant in terms of polystyrene by GPC is preferably 1,000 to 50,000, and more preferably 2,000 to 20,000. If it is within the range, surface modifying effect is sufficient and development defect is less likely generated.

The above-mentioned surfactant that is insoluble or difficultly soluble in water and soluble in an alkali developing solution can be also referred to JP 2008-122932A, JP 2010-134012A, JP 2010-107695A, JP 2009-276363A, JP 2009-192784A, JP 2009-191151A, JP 2009-98638A, JP 2010-250105A, JP 2011-42789A, and so on.

A formulation amount of the above-mentioned surfactant may be 0 to 20 parts by mass based on 100 parts by mass of the base resin, and when it is formulated, the lower limit thereof is preferably 0.001 part by mass, and more preferably 0.01 part by mass. On the other hand, the upper limit thereof is preferably 15 parts by mass, and more preferably 10 parts by mass.

[Patterning Process]

The present invention is further to provide a patterning process which is a patterning process including forming a resist film on a substrate using the above-mentioned resist composition, laying a mask over the resist film, exposing the film by irradiating a high energy beam, and then, developing with an alkali developing solution to form a pattern on the substrate, wherein the exposure with the high energy beam is carried out by a KrF excimer laser having a wavelength of 248 nm, an ArF excimer laser having a wavelength of 193 nm, EUV having a wavelength of 13.5 nm, or electron beam.

For forming a pattern using the resist composition of the present invention, it can be carried out by using a conventionally known lithography technology and, for example, the composition is coated on a substrate (Si, $SiO_2$, SiN, SiON, TiN, WSi, BPSG, SOG, an organic antireflection film, etc.) for manufacturing an integrated circuit, or on a substrate (Cr, CrO, CrON, MoSi, etc.) for manufacturing a mask circuit by a means of spin coating, etc., so that the film thickness becomes 0.05 to 2.0 μm, and this is prebaked on a hot plate at 60 to 150° C. for 1 to 10 minutes, preferably at 80 to 140° C. for 1 to 5 minutes. Then, a mask for forming an objective pattern is laying over the resist film, and a high energy beam such as KrF excimer laser, ArF excimer laser or EUV is irradiated so that the exposure amount becomes 1 to 200 $mJ/cm^2$, preferably 10 to 100 $mJ/cm^2$. For exposure, in addition to the usual exposure method, it is also possible to use an immersion method which immerse with a liquid between the mask and the resist film in some cases. In such a case, it is possible to use a protective film insoluble in water. Then, post exposure baking (PEB) is carried out on a hot plate at 60 to 150° C. for 1 to 5 minutes, preferably at 80 to 140° C. for 1 to 3 minutes. Further, using a developing solution of an aqueous alkali solution such as 0.1 to 5% by mass, preferably 2 to 3% by mass of tetramethylammonium hydroxide (TMAH) and the like, 0.1 to 3 minutes, preferably 0.5 to 2 minutes, development is carried out by a conventional method such as a dipping method, a paddle method, a spray method, etc., whereby an objective pattern is formed on the substrate.

As the developing solution for the patterning process of the present invention, a developing solution of an aqueous alkali solution such as 0.1 to 5% by mass, preferably 2 to 3% by mass of tetramethylammonium hydroxide (TMAH), etc., can be used as mentioned above.

EXAMPLE

In the following, the present invention will be explained specifically by referring to Examples and Comparative Examples, but the present invention is not limited by these descriptions.

The structures of each repeating unit are shown below.

[Units (p-1) to (p-3)]

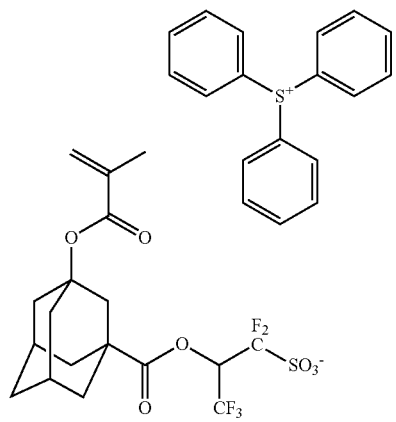

A-1

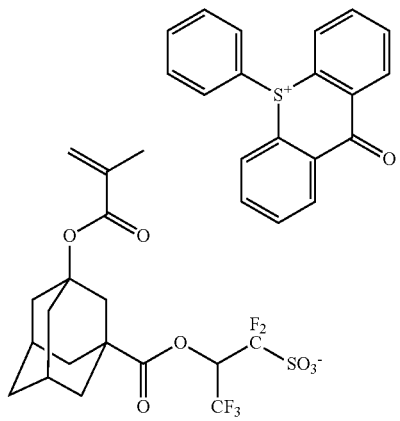

A-2

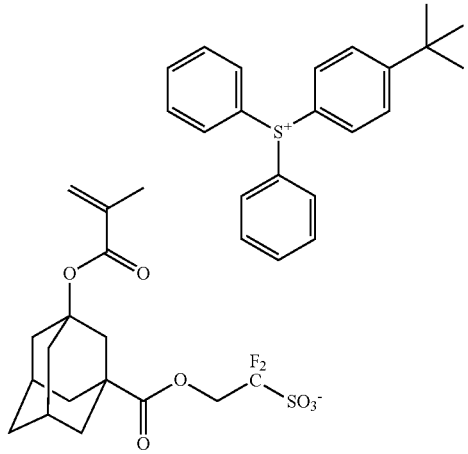

A-3

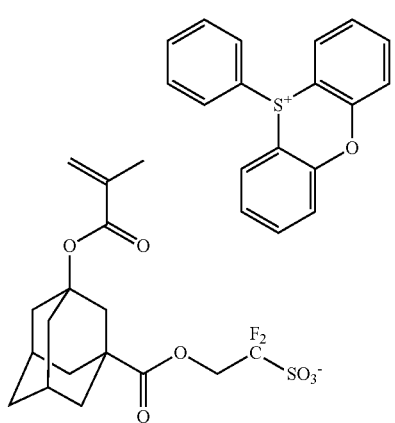

A-4

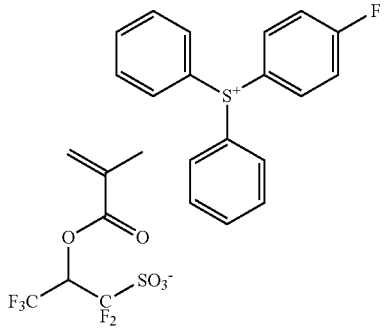

A-5

A-6
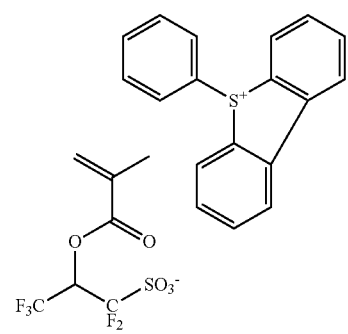
A-7
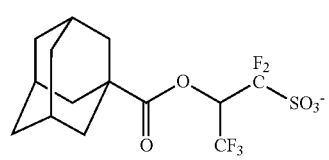
A-8
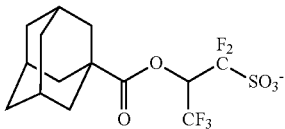
[Unit (a-1)]
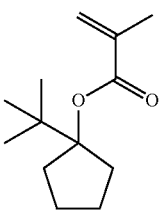
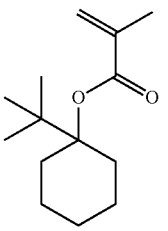
A-6
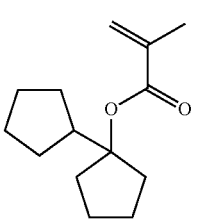
A-7
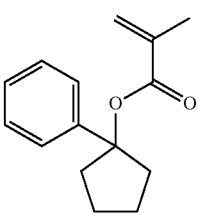
A-8
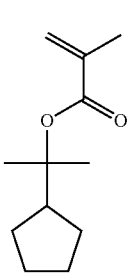
B-1
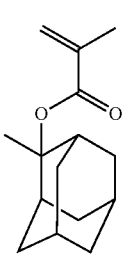
B-2
B-3
B-4
B-5
B-6
B-7
B-8
B-9
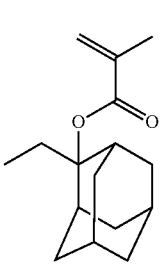
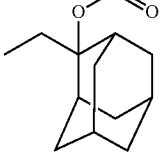
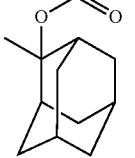
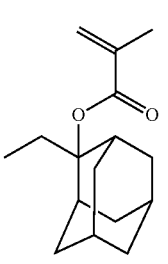
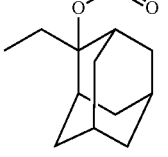

B-10 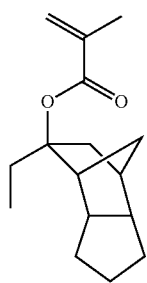
B-11 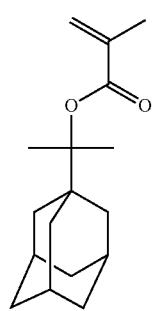
B-12 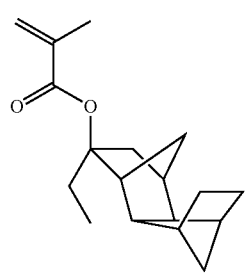
B-13 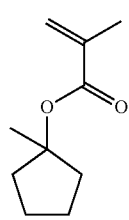
B-14 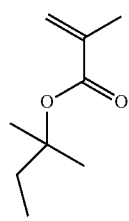
B-15 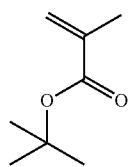
[Unit (a-2)]
C-1 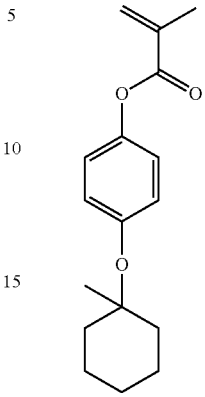
C-2 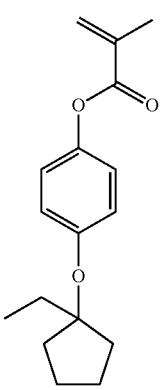
C-3 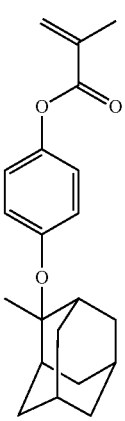
C-4 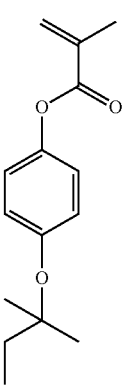

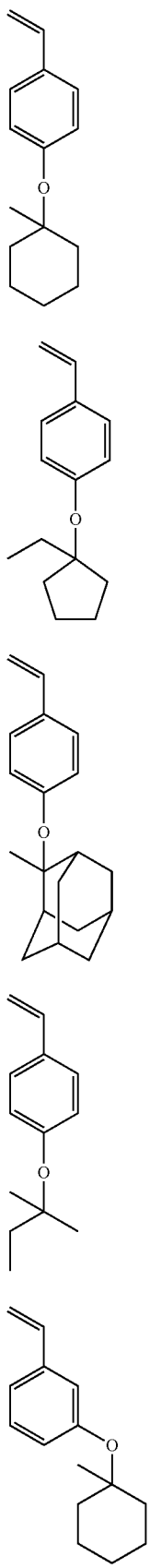
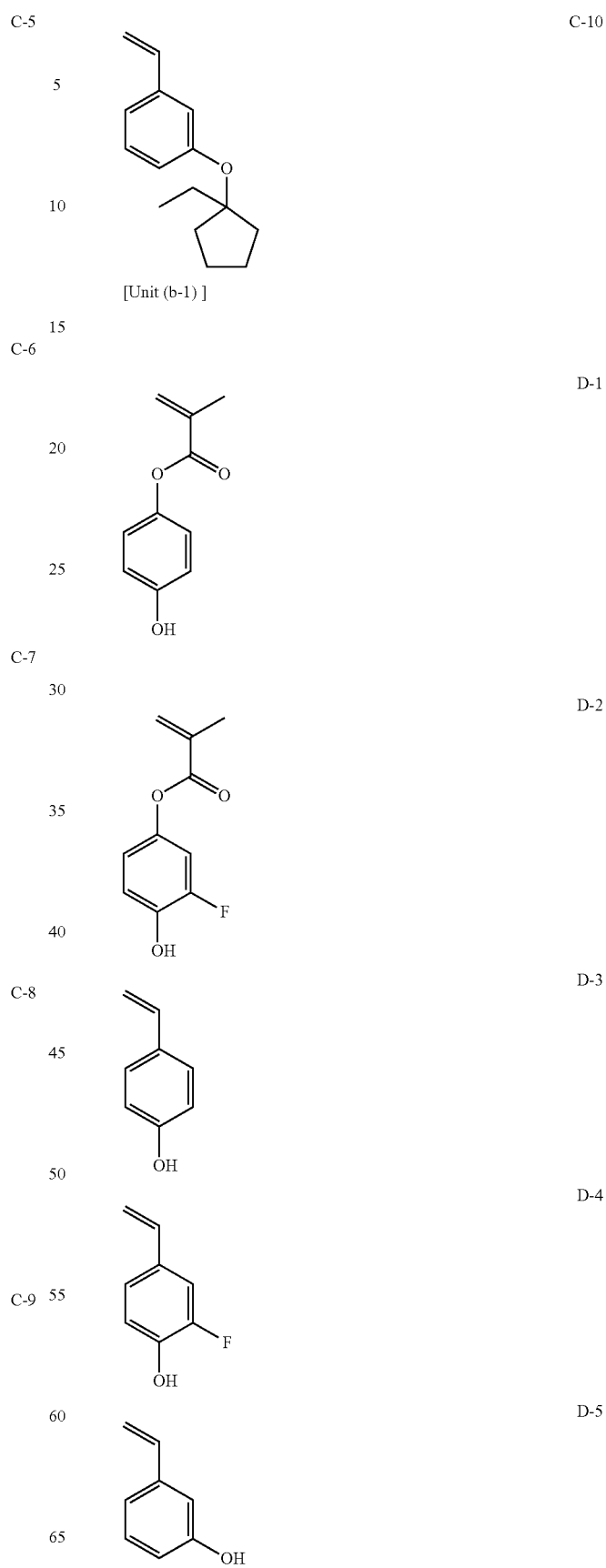

-continued
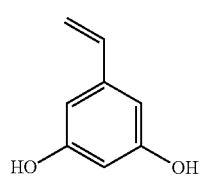
[Unit (c-1)]
E-1
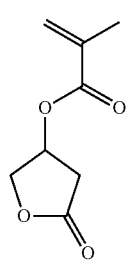
E-2
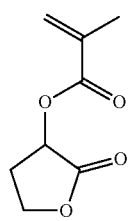
E-3
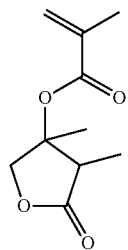
E-4
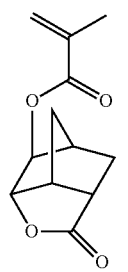
E-5
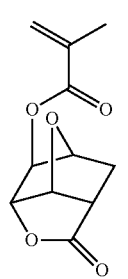
D-6
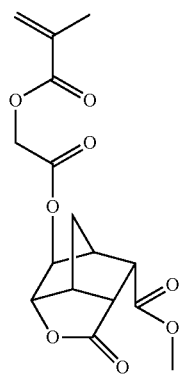
E-6
E-7
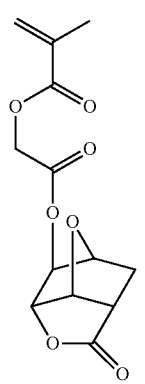
E-8
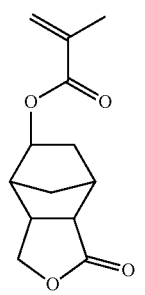
E-9
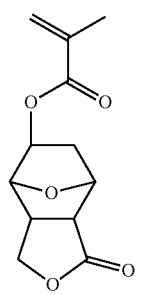

POLYMER SYNTHETIC EXAMPLES

Polymer Synthetic Example 1

Under nitrogen atmosphere, in a flask were charged 5.7 g of Monomer A-1, 2.6 g of Monomer B-1, 6.3 g of Monomer C-1, 5.5 g of Monomer D-1, 0.24 g of V-601 (available from FUJI FILM Wako Pure Chemical Corporation), 0.2 g of 2-mercaptoethanol and 25 g of methyl ethyl ketone to prepare a monomer-polymerization initiator solution. In a separate flask which was made nitrogen atmosphere was charged 23 g of methyl ethyl ketone, and after heating to 80° C. under stirring, the monomer-polymerization initiator solution was added dropwise over 4 hours. After completion of dropwise addition, stirring was continued while maintaining the temperature of the polymerization solution at 80° C. for 2 hours, and then, cooled to room temperature. The obtained polymerization solution was added dropwise to 320 g of vigorously stirring methanol, and the precipitated polymer was separated by filtration. The polymer was washed twice with 120 g of methanol, and then, dried at 50° C. for 20 hours under vacuum to obtain 18 g of white powder state Polymer P-1.

Polymer Synthetic Examples 2 to 44

According to the similar procedure, Polymers P-2 to P-44 were synthesized with the monomer composition and introducing ratio shown in Table 1.

TABLE 1

| Polymer compound | Unit 1 (introducing ratio) | | Unit 2 (introducing ratio) | | Unit 3 (introducing ratio) | | Unit 4 (introducing ratio) | | Unit 5 (introducing ratio) | |
|---|---|---|---|---|---|---|---|---|---|---|
| P-1 | A-1 | 0.10 | B-1 | 0.20 | C-1 | 0.30 | D-1 | 0.40 | | |
| P-2 | A-1 | 0.15 | B-2 | 0.10 | C-2 | 0.40 | D-2 | 0.35 | | |
| P-3 | A-1 | 0.10 | B-3 | 0.25 | C-1 | 0.25 | D-3 | 0.40 | | |
| P-4 | A-1 | 0.10 | B-4 | 0.20 | C-1 | 0.30 | D-4 | 0.40 | | |
| P-5 | A-1 | 0.10 | B-5 | 0.20 | C-1 | 0.30 | D-5 | 0.40 | | |
| P-6 | A-1 | 0.20 | B-6 | 0.25 | C-5 | 0.25 | D-6 | 0.30 | | |
| P-7 | A-1 | 0.10 | B-7 | 0.20 | C-1 | 0.40 | D-1 | 0.30 | | |
| P-8 | A-1 | 0.10 | B-8 | 0.10 | C-2 | 0.40 | D-1 | 0.40 | | |
| P-9 | A-1 | 0.20 | B-9 | 0.20 | C-1 | 0.30 | D-1 | 0.30 | | |
| P-10 | A-1 | 0.15 | B-10 | 0.20 | C-1 | 0.40 | D-1 | 0.25 | | |
| P-11 | A-1 | 0.15 | B-1 | 0.20 | C-1 | 0.30 | D-3 | 0.20 | E-1 | 0.15 |
| P-12 | A-2 | 0.15 | B-1 | 0.20 | C-5 | 0.40 | D-3 | 0.25 | | |
| P-13 | A-3 | 0.15 | B-1 | 0.10 | C-6 | 0.40 | D-2 | 0.20 | E-1 | 0.15 |
| P-14 | A-4 | 0.10 | B-1 | 0.20 | C-9 | 0.30 | D-5 | 0.40 | | |
| P-15 | A-5 | 0.10 | B-2 | 0.30 | C-5 | 0.20 | D-5 | 0.20 | E-2 | 0.20 |
| P-16 | A-6 | 0.15 | B-2 | 0.10 | C-6 | 0.30 | D-5 | 0.45 | | |
| P-17 | A-7 | 0.10 | B-2 | 0.20 | C-9 | 0.30 | D-5 | 0.40 | | |
| P-18 | A-8 | 0.10 | B-2 | 0.10 | C-10 | 0.35 | D-1 | 0.45 | | |
| P-19 | A-1 | 0.10 | B-2 | 0.10 | C-1 | 0.30 | D-1 | 0.25 | E-3 | 0.25 |
| P-20 | A-2 | 0.10 | B-1 | 0.20 | C-1 | 0.30 | D-1 | 0.20 | E-4 | 0.20 |
| P-21 | A-2 | 0.10 | B-1 | 0.20 | C-1 | 0.30 | D-2 | 0.20 | E-5 | 0.20 |
| P-22 | A-2 | 0.15 | B-1 | 0.20 | C-2 | 0.20 | D-2 | 0.20 | E-6 | 0.25 |
| P-23 | A-3 | 0.15 | B-2 | 0.20 | C-1 | 0.20 | D-1 | 0.20 | E-7 | 0.25 |
| P-24 | A-2 | 0.10 | B-2 | 0.20 | C-5 | 0.30 | D-3 | 0.25 | E-8 | 0.15 |
| P-25 | A-2 | 0.15 | B-2 | 0.10 | C-1 | 0.35 | D-3 | 0.20 | E-9 | 0.20 |
| P-26 | A-2 | 0.10 | B-3 | 0.10 | C-1 | 0.30 | D-1 | 0.30 | E-7 | 0.20 |
| P-27 | A-4 | 0.10 | B-3 | 0.10 | C-1 | 0.30 | D-3 | 0.25 | E-3 | 0.25 |
| P-28 | A-2 | 0.10 | B-3 | 0.20 | C-2 | 0.20 | D-1 | 0.25 | E-4 | 0.25 |
| P-29 | A-3 | 0.10 | B-3 | 0.20 | C-5 | 0.30 | D-3 | 0.20 | E-5 | 0.20 |
| P-30 | A-1 | 0.15 | B-11 | 0.10 | C-1 | 0.35 | D-3 | 0.40 | | |
| P-31 | A-1 | 0.20 | B-12 | 0.10 | C-1 | 0.35 | D-5 | 0.35 | | |
| P-32 | A-2 | 0.15 | B-13 | 0.20 | C-5 | 0.30 | D-6 | 0.35 | | |
| P-33 | A-1 | 0.10 | B-14 | 0.20 | C-1 | 0.20 | D-1 | 0.30 | E-4 | 0.20 |
| P-34 | A-2 | 0.10 | B-15 | 0.10 | C-1 | 0.35 | D-1 | 0.30 | E-7 | 0.15 |
| P-35 | A-3 | 0.10 | B-3 | 0.50 | | | D-5 | 0.20 | E-4 | 0.20 |
| P-36 | A-1 | 0.15 | B-13 | 0.45 | | | D-1 | 0.20 | E-5 | 0.20 |
| P-37 | A-1 | 0.10 | B-3 | 0.20 | C-3 | 0.30 | D-3 | 0.40 | | |
| P-38 | A-3 | 0.10 | B-4 | 0.20 | C-4 | 0.35 | D-4 | 0.25 | E-3 | 0.10 |
| P-39 | A-4 | 0.10 | | | C-1 | 0.50 | D-1 | 0.40 | | |
| P-40 | A-4 | 0.15 | B-3 | 0.20 | C-1 | 0.20 | | | E-1 | 0.45 |
| P-41 | A-4 | 0.10 | B-9 | 0.60 | | | | | E-1 | 0.30 |
| P-42 | A-4 | 0.15 | B-1 | 0.50 | | | D-2 | 0.35 | | |
| P-43 | A-4 | 0.15 | B-5 | 0.20 | C-7 | 0.30 | D-3 | 0.35 | | |
| P-44 | A-1 | 0.10 | B-6 | 0.20 | C-8 | 0.30 | D-4 | 0.40 | | |

[Preparation of Resist Composition]

Next, the above-mentioned polymer compounds, various kinds of onium salt 1 (generated acid has pKa of −1 or more) and onium salt 2 (generated acid has pKa of less than −1), and a nitrogen-containing compound were mixed, and an alkali soluble type surfactant: the polymer compound SF-1 was added to a part of the resist as a surfactant, and FC-4430 available from Sumitomo 3M Limited was added as a surfactant to all the resists with 100 ppm and dissolved. After dissolution, the solution was filtered through a filter (diameter: 0.2 μm) made of Teflon (Registered Trademark) to prepare the resist compositions shown in the following Tables 2-1, 2-2 and 3.

TABLE 2-1

| Resist | Polymer compound (parts by mass) | Onium salt 1 (parts by mass) | Onium salt 2 (parts by mass) | Nitrogen-containing compoud (parts by mass) | Solvent (parts by mass) |
|---|---|---|---|---|---|
| R-1 | P-1 100 | Salt 1-1 6.0 | | | PGMEA 4000 GBL 1000 |
| R-2 | P-2 100 | Salt 1-1 4.0 | | | PGMEA 4000 GBL 1000 |
| R-3 | P-3 100 | Salt 1-2 4.0 | Salt 2-1 3.3 | | PGMEA 4000 GBL 1000 |
| R-4 | P-4 100 | Salt 1-3 5.0 | | AQ-3 2.0 | PGMEA 4000 GBL 1000 |
| R-5 | P-5/SF-1 100/7 | Salt 1-4 4.2 | | | PGMEA 4000 GBL 1000 |
| R-6 | P-6 100 | Salt 1-4 5.6 | | | PGMEA 4000 GBL 1000 |
| R-7 | P-7 100 | Salt 1-2 4.0 | Salt 2-1 4.5 | | PGMEA 4000 GBL 1000 |
| R-8 | P-8 100 | Salt 1-2 4.0 | | | PGMEA 4000 GBL 1000 |
| R-9 | P-9/SF-1 100/7 | Salt 1-3 5.0 | Salt 2-1 5.7 | | PGMEA 4000 GBL 1000 |
| R-10 | P-10 100 | Salt 1-2 4.0 | | AQ-3 1.8 | PGMEA 4000 GBL 1000 |
| R-11 | P-11 100 | Salt 1-1 6.0 | | | PGMEA 4000 GBL 1000 |
| R-12 | P-12 100 | Salt 1-1 6.0 | | | PGMEA 4000 GBL 1000 |
| R-13 | P-13 100 | Salt 1-3 4.3 | | | PGMEA 4000 GBL 1000 |
| R-14 | P-14 100 | Salt 1-1 6.0 | | | PGMEA 4000 GBL 1000 |
| R-15 | P-15 100 | Salt 1-3 4.3 | | | PGMEA 4000 GBL 1000 |
| R-16 | P-16 100 | Salt 1-4 5.0 | | | PGMEA 4000 GBL 1000 |
| R-17 | P-17 100 | Salt 1-1 5.0 | | | PGMEA 4000 GBL 1000 |
| R-18 | P-18 100 | Salt 1-1 6.0 | Salt 2-1 6.0 | | PGMEA 4000 GBL 1000 |
| R-19 | P-19 100 | Salt 1-1 4.0 | Salt 2-2 4.0 | | PGMEA 4000 GBL 1000 |
| R-20 | P-20 100 | Salt 1-1 5.0 | | | PGMEA 4000 GBL 1000 |

TABLE 2-2

| Resist | Polymer compound (parts by mass) | Onium salt 1 (parts by mass) | Onium salt 2 (parts by mass) | Nitrogen-containing compoud (parts by mass) | Solvent (parts by mass) |
|---|---|---|---|---|---|
| R-21 | P-21 100 | Salt 1-2 6.0 | | | PGMEA 4000 GBL 1000 |
| R-22 | P-22 100 | Salt 1-4 4.3 | | | PGMEA 4000 GBL 1000 |
| R-23 | P-23 100 | Salt 1-4 5.0 | | | PGMEA 4000 GBL 1000 |
| R-24 | P-24 100 | Salt 1-2 5.0 | | | PGMEA 4000 GBL 1000 |
| R-25 | P-25 100 | Salt 1-2 4.3 | | AQ-3 2.2 | PGMEA 4000 GBL 1000 |
| R-26 | P-26 100 | Salt 1-1 5.0 | | | PGMEA 4000 GBL 1000 |
| R-27 | P-27 100 | Salt 1-1 4.3 | | | PGMEA 4000 GBL 1000 |
| R-28 | P-28 100 | Salt 1-1 4.3 | | | PGMEA 4000 GBL 1000 |
| R-29 | P-29 100 | Salt 1-1 4.3 | | | PGMEA 4000 GBL 1000 |

TABLE 3

| Resist | Polymer compound (parts by mass) | Onium salt 1 (parts by mass) | Onium salt 2 (parts by mass) | Nitrogen-containing compound (parts by mass) | Solvent (parts by mass) |
|---|---|---|---|---|---|
| R-30 | P-1 100 | Salt 1-5 4.5 | | | PGMEA 4000 GBL 1000 |
| R-31 | P-2/SF-1 100/7 | Salt 1-6 5.0 | | | PGMEA 4000 GBL 1000 |
| R-32 | P-3 100 | Salt 1-5 5.0 | Salt 2-1 8.0 | | PGMEA 4000 GBL 1000 |
| R-33 | P-4 100 | | Salt 2-1 4.0 | AQ-1 1.2 | PGMEA 4000 GBL 1000 |
| R-34 | P-5 100 | Salt 1-6 5.0 | | | PGMEA 4000 GBL 1000 |
| R-35 | P-7 100 | | Salt 2-1 3.0 | AQ-2 2.3 | PGMEA 4000 GBL 1000 |
| R-36 | P-3 100 | | | AQ-3 2.4 | PGMEA 4000 GBL 1000 |
| R-37 | P-30/SF-1 100/7 | Salt 1-1 4.3 | | | PGMEA 4000 GBL 1000 |
| R-38 | P-31 100 | Salt 1-1 6.0 | | | PGMEA 4000 GBL 1000 |
| R-39 | P-32 100 | Salt 1-2 4.8 | | AQ-4 3.0 | PGMEA 4000 GBL 1000 |
| R-40 | P-33 100 | Salt 1-3 4.3 | | | PGMEA 4000 GBL 1000 |
| R-41 | P-34 100 | Salt 1-4 5.0 | | | PGMEA 4000 GBL 1000 |
| R-42 | P-35 100 | Salt 1-2 4.0 | | | PGMEA 4000 GBL 1000 |
| R-43 | P-36 100 | Salt 1-3 5.0 | Salt 2-1 7.0 | | PGMEA 4000 GBL 1000 |
| R-44 | P-37 100 | Salt 1-2 4.8 | | | PGMEA 4000 GBL 1000 |
| R-45 | P-38 100 | Salt 1-4 4.3 | | | PGMEA 4000 GBL 1000 |
| R-46 | P-39 100 | Salt 1-2 6.0 | | AQ-3 2.4 | PGMEA 4000 GBL 1000 |
| R-47 | P-40 100 | Salt 1-3 5.0 | | AQ-4 2.0 | PGMEA 4000 GBL 1000 |
| R-48 | P-41 100 | Salt 1-2 4.3 | | | PGMEA 4000 GBL 1000 |
| R-49 | P-42 100 | Salt 1-4 5.0 | Salt 2-2 6.0 | | PGMEA 4000 GBL 1000 |
| R-50 | P-43 100 | Salt 1-3 4.3 | | | PGMEA 4000 GBL 1000 |
| R-51 | P-44 100 | Salt 1-2 5.0 | | | PGMEA 4000 GBL 1000 |

Formulae of Onium salt 1 and Onium salt 2, a nitrogen-containing compound, and a composition of an alkali soluble type surfactant are shown below.
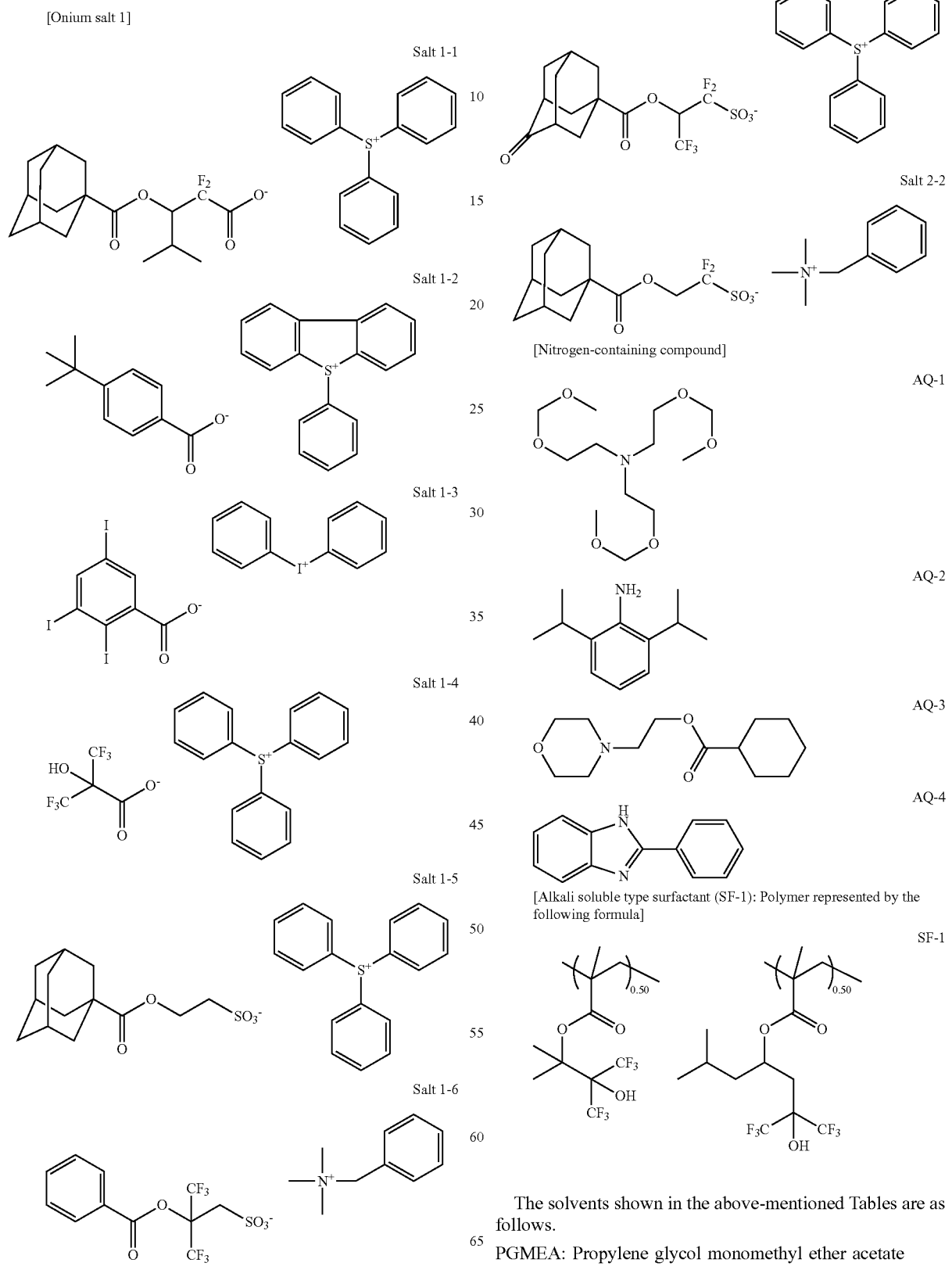
The solvents shown in the above-mentioned Tables are as follows.
PGMEA: Propylene glycol monomethyl ether acetate
GBL: γ-butyrolactone The C log P value was confirmed by using a software of ChemDraw Ultra (Registered Trademark) available from Cambridge Soft Corporation. In order to reproduce the state at the time of introducing the polymer, the polymerizable group of the monomer was calculated in the state of reduction. The calculation results are shown in Table 4. The ΔC log P value represents the difference between the C log P value before deprotection with an acid and the C log P value related to the main chain after deprotection. In the present invention, in Monomer B-1 to B-15 which correspond to the repeating unit (a-1), polymers using B1 to B10 in which ΔC log P is within the range of 3.0 to 4.5 correspond to Examples, and polymers using B-11 to B-15 which are out of the range correspond to Comparative Examples. Similarly, in Monomers C-1 to C-10 corresponding to the repeating unit (a-2), polymers using C-1 to C-2, C-5 to C-6, and C-9 to C-10 in which ΔC log P is within the range of 2.5 to 3.2 correspond to Examples, and polymers using C-3 to C-4, C-7 to C-8 which are out of the range correspond to Comparative Examples.

TABLE 4

| Monomer | ClogP | ΔClogP |
|---|---|---|
| B-1 | 4.10 | 3.46 |
| B-2 | 3.94 | 3.30 |
| B-3 | 4.34 | 3.69 |
| B-4 | 4.90 | 4.25 |
| B-5 | 4.48 | 3.84 |
| B-6 | 4.26 | 3.62 |
| B-7 | 3.82 | 3.18 |
| B-8 | 4.20 | 3.55 |
| B-9 | 4.73 | 4.08 |
| B-10 | 4.73 | 4.08 |
| B-11 | 6.05 | 5.40 |
| B-12 | 5.56 | 4.92 |
| B-13 | 3.01 | 2.37 |
| B-14 | 2.79 | 2.14 |
| B-15 | 2.26 | 1.61 |
| C-1 | 4.96 | 3.12 |
| C-2 | 4.93 | 3.09 |
| C-3 | 5.59 | 3.75 |
| C-4 | 4.18 | 2.34 |
| C-5 | 5.34 | 2.83 |
| C-6 | 5.31 | 2.80 |
| C-7 | 5.96 | 3.46 |
| C-8 | 4.55 | 2.05 |
| C-9 | 5.34 | 2.83 |
| C-10 | 5.31 | 2.80 |

[EUV Exposure Patterning Evaluation (Hole Pattern Evaluation)]

The resist compositions (R-1 to R-29) of the present invention and the resist compositions (R-30 to R-51) for comparison were each coated on a substrate onto which an organic antireflection film AL-412 available from BRUWER SCIENCE, Inc. having a film thickness of 20 nm had been formed using CLEAN TRACK Lithius ProZ manufactured by Tokyo Electron Limited, and baked on a hot plate at 105° C. for 60 seconds to form a resist film with 50 nm. Using an EUV exposure apparatus NXE3300 manufactured by ASML Holding, a lattice pattern of 27.5 nm at a size of the pitch on the mask of 46 nm was exposed, and after the exposure, a PEB temperature suitable for each resist composition was applied, then, 2.38% aqueous tetramethylammonium solution was discharged while rotating the wafer to carry out development for 30 seconds in total, the alkali solution was washed away with water, and the wafer was rotated at a high speed to remove water.

(Sensitivity Evaluation)

The prepared resist pattern was observed by CD-SEM CG-5000 manufactured by Hitachi High-Technologies Corporation, and the exposure amount at which the hole diameter became 23 nm at a pitch of 46 nm was made the optimum exposure amount Eop (mJ/cm$^2$).

(Evaluation of Critical Dimension Uniformity (CDU))

The obtained hole pattern was observed by CD-SEM CG-5000 manufactured by Hitachi High-Technologies Corporation, and the hole diameter was measured at 32 points with one hole per one sample, 49 holes were measured from one sheet of the SEM image, then, the triple value (3σ) of the standard deviation (σ) calculated from the results was obtained, 30 sheets of SEM images were obtained and the average value of the standard deviation was made CDU. CDU means that the value is smaller, the critical dimension uniformity is excellent. CDU is judged to be good with about 3.0 or less. DOF indicates depth of focus. It is judged to be good with about 140 nm or more.

TABLE 5

| | Resist composition | PEB (° C.) | Eop (mJ/cm$^2$) | CDU (nm) | DOF (nm) |
|---|---|---|---|---|---|
| Example 1-1 | R-1 | 90 | 31 | 2.5 | 150 |
| Example 1-2 | R-2 | 80 | 33 | 2.6 | 145 |
| Example 1-3 | R-3 | 80 | 27 | 2.7 | 150 |
| Example 1-4 | R-4 | 80 | 27 | 2.5 | 155 |
| Example 1-5 | R-5 | 85 | 29 | 2.4 | 150 |
| Example 1-6 | R-6 | 90 | 28 | 2.4 | 155 |
| Example 1-7 | R-7 | 95 | 34 | 2.5 | 145 |
| Example 1-8 | R-8 | 100 | 31 | 2.6 | 155 |
| Example 1-9 | R-9 | 95 | 25 | 2.7 | 160 |
| Example 1-10 | R-10 | 85 | 30 | 2.4 | 160 |
| Example 1-11 | R-11 | 90 | 32 | 2.5 | 155 |
| Example 1-12 | R-12 | 90 | 33 | 2.4 | 150 |
| Example 1-13 | R-13 | 85 | 33 | 2.4 | 160 |
| Example 1-14 | R-14 | 85 | 31 | 2.3 | 155 |
| Example 1-15 | R-15 | 80 | 32 | 2.6 | 165 |
| Example 1-16 | R-16 | 80 | 27 | 2.7 | 145 |
| Example 1-17 | R-17 | 90 | 30 | 2.7 | 150 |
| Example 1-18 | R-18 | 90 | 34 | 2.6 | 155 |
| Example 1-19 | R-19 | 85 | 30 | 2.5 | 155 |
| Example 1-20 | R-20 | 80 | 33 | 2.6 | 150 |
| Example 1-21 | R-21 | 85 | 37 | 2.7 | 155 |
| Example 1-22 | R-22 | 85 | 36 | 2.6 | 160 |
| Example 1-23 | R-23 | 80 | 35 | 2.5 | 165 |
| Example 1-24 | R-24 | 90 | 35 | 2.6 | 160 |
| Example 1-25 | R-25 | 85 | 32 | 2.8 | 160 |
| Example 1-26 | R-26 | 80 | 30 | 2.6 | 165 |
| Example 1-27 | R-27 | 85 | 31 | 2.5 | 150 |
| Example 1-28 | R-28 | 90 | 35 | 2.6 | 155 |
| Example 1-29 | R-29 | 90 | 36 | 2.7 | 160 |

TABLE 6

| | Resist composition | PEB (° C.) | Eop (mJ/cm$^2$) | CDU (nm) | DOF (nm) |
|---|---|---|---|---|---|
| Comparative Example 1-1 | R-30 | 95 | 28 | 3.2 | 120 |
| Comparative Example 1-2 | R-31 | 90 | 30 | 3.5 | 135 |
| Comparative Example 1-3 | R-32 | 80 | 25 | 3.5 | 135 |
| Comparative Example 1-4 | R-33 | 80 | 30 | 3.8 | 140 |
| Comparative Example 1-5 | R-34 | 80 | 30 | 3.2 | 100 |
| Comparative Example 1-6 | R-35 | 95 | 26 | 3.9 | 95 |
| Comparative Example 1-7 | R-36 | 85 | 32 | 3.7 | 80 |
| Comparative Example 1-8 | R-37 | 95 | 28 | 3.2 | 165 |

TABLE 6-continued

| | Resist composition | PEB (° C.) | Eop (mJ/cm²) | CDU (nm) | DOF (nm) |
|---|---|---|---|---|---|
| Comparative Example 1-9 | R-38 | 90 | 30 | 3.5 | 175 |
| Comparative Example 1-10 | R-39 | 95 | 31 | 3.5 | 120 |
| Comparative Example 1-11 | R-40 | 100 | 36 | 2.8 | 105 |
| Comparative Example 1-12 | R-41 | 105 | 37 | 2.7 | 100 |
| Comparative Example 1-13 | R-42 | 85 | 26 | 2.5 | 95 |
| Comparative Example 1-14 | R-43 | 85 | 32 | 2.2 | 80 |
| Comparative Example 1-15 | R-44 | 95 | 30 | 3.5 | 145 |
| Comparative Example 1-16 | R-45 | 100 | 35 | 3.6 | 110 |
| Comparative Example 1-17 | R-46 | 100 | 33 | 3.8 | 150 |
| Comparative Example 1-18 | R-47 | 110 | 33 | 4.2 | 140 |
| Comparative Example 1-19 | R-48 | 100 | 30 | 4.0 | 160 |
| Comparative Example 1-20 | R-49 | 90 | 32 | 2.8 | 75 |
| Comparative Example 1-21 | R-50 | 100 | 29 | 3.4 | 140 |
| Comparative Example 1-22 | R-51 | 90 | 29 | 3.1 | 120 |

From the results shown in Tables 5 and 6, it was found that the resist compositions of the present invention (Examples 1-1 to 1-29) had CDU of 3.0 or less, and DOF (depth of focus) of 140 nm or more, and in the positive pattern formation by development of the aqueous alkali solution, these were excellent in CDU, and sufficiently wide DOF. On the other hand, in Comparative Examples (Comparative Examples 1-1 to 1-22), both of CDU and DOF do not satisfy the above-mentioned numerical range. From the above, it was shown that the resist composition of the present invention was useful for the aqueous alkali solution development process.

Evaluation of Swelling of Resist Composition During Development Using QCM (Quartz Crystal Microbalance) Method The resist compositions of the present invention and the resist compositions of Comparative Examples prepared with the composition shown in Tables 2-1 and 2-2 were each spin coated on a QCM substrate so that the thickness became 100 nm, and baked on a hot plate at 105° C. for 60 seconds. Thereafter, exposure was carried out at an exposure amount of from 1 mJ/cm² to 13 mJ/cm² with a step of 1 mJ/cm² by an ArF open flame exposure apparatus, and after the exposure, baking (PEB) was carried out using a hot plate at a temperature shown in Table 7 for 60 seconds. Thereafter, the resist film on the QCM substrate was observed by using a development analysis apparatus RDA-Qz3 (manufactured by Litho Tech Japan Corporation), that is, variation of the resist film thickness to the development time in a developing solution of 2.38% by weight tetramethylammonium hydroxide (TMAH) aqueous solution was observed. From the graph showing the development time and variation of the film thickness in each exposure amount, the exposure amount showing the maximum swelling amount, and the maximum swelling amount ratio (a value in which the maximum swelling amount is standardized with an initial film thickness) are shown in Table 7. As the maximum swelling amount ratio is smaller, swelling of the resist film is suppressed.

TABLE 7

| | Resist | PEB temperature (° C.) | Exposed amount (mJ/cm2) | Maximum swelling amount ratio |
|---|---|---|---|---|
| Example 2-1 | R-1 | 90 | 7 | 133% |
| Example 2-2 | R-2 | 80 | 6 | 117% |
| Example 2-3 | R-12 | 90 | 6 | 132% |
| Comparative Example 2-1 | R-43 | 85 | 5 | 180% |
| Comparative Example 2-2 | R-46 | 100 | 7 | 110% |
| Comparative Example 2-3 | R-49 | 90 | 6 | 201% |

From the results of Table 7, it was confirmed that the resist compositions (Examples 2-1 to 2-3) containing the repeating unit (a-2) of the present invention had smaller maximum swelling amount ratio than that of the resist compositions (Comparative Examples 2-1 and 2-3) which did not contain the repeating unit (a-2). Comparative Example 2-2 contains the repeating unit (a-2) but does not contain the repeating unit (a-1), so that the maximum swelling amount ratio was confirmed to be small.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

The invention claimed is:

1. A resist composition comprising:
   a polymer compound having
      one or two repeating units selected from repeating units represented by the following general formulae (p-1), (p-2) and (p-3),
      a repeating unit represented by the following formula (a-1) and a repeating unit represented by the following formula (a-2) the polarities of which are changed by an action of an acid, and
      a repeating unit represented by the following formula (b-1);
   a salt represented by the following general formula (B); and
   a solvent,
   wherein a difference between a C log P of the repeating unit (a-1) and a C log P of the repeating unit (a-1) after changing the polarity thereof by an action of an acid is 3.3 to 4.2, and a difference between a C log P of the repeating unit (a-2) and a C log P of the repeating unit (a-2) after changing the polarity thereof by an action of an acid is 2.5 to 3.2:

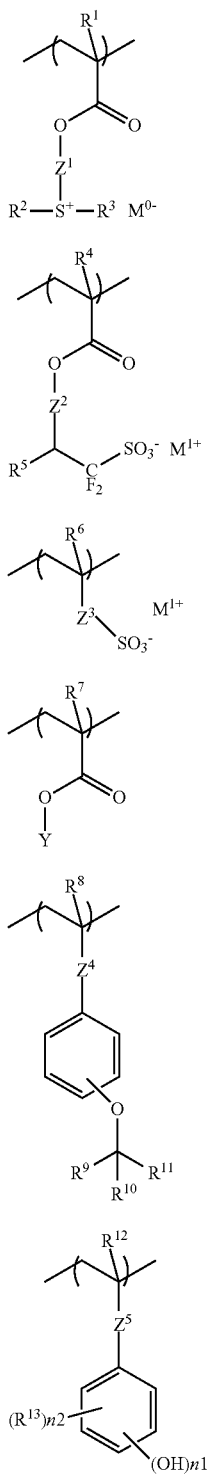

(p-1)
(p-2)
(p-3)
(a-1)
(a-2)
(b-1)

in the above-mentioned formulae (p-1), (p-2) and (p-3), $R^1$, $R^4$ and $R^6$ are each independently a hydrogen atom or a methyl group;

$Z^1$ is a single bond, a phenylene group, $-O-Z^{11}-$, $-C(=O)-O-Z^{11}-$ or $-C(=O)-NH-Z^{11}-$;

$Z^{11}$ is an alkanediyl group having 1 to 6 carbon atoms or an alkenediyl group having 2 to 6 carbon atoms, or a phenylene group, each of which may contain a carbonyl group, an ester bond, an ether bond or a hydroxyl group;

$Z^2$ is a single bond, $-Z^{21}-C(O)-O-$, $-Z^{21}-O-$ or $-Z^{21}-O-C(=O)-$, $Z^{21}$ is an alkanediyl group having 1 to 12 carbon atoms, and may contain a carbonyl group, an ester bond or an ether bond;

$R^2$ to $R^3$ are each independently a monovalent hydrocarbon group having 1 to 20 carbon atoms which may contain a hetero atom(s);

$R^5$ is a hydrogen atom or a trifluoromethyl group;

$Z^3$ is a single bond, a methylene group, an ethylene group, a phenylene group, a fluorinated phenylene group, $-O-Z^{31}-$, $-C(=O)-O-Z^{31}-$ or $-C(=O)-NH-Z^{31}-$, $Z^{31}$ is an alkylene group having 1 to 6 carbon atoms, a phenylene group, a fluorinated phenylene group, a phenylene group substituted with a trifluoromethyl group, or a linear, branched or cyclic alkenylene group having 2 to 6 carbon atoms, each of which may contain a carbonyl group, an ester bond, an ether bond or a hydroxyl group;

$M^{1+}$ represents a counter cation having a substituent(s), and represents a sulfonium cation, an iodonium cation or an ammonium cation;

$M^{0-}$ is a non-nucleophilic counter ion;

in the above-mentioned formula (a-1), $R^7$ is a hydrogen atom or a methyl group;

Y has a structure that changes its polarity by an action of an acid and becomes soluble in an aqueous alkali solution;

in the above-mentioned formula (a-2), $R^8$ is a hydrogen atom or a methyl group;

$Z^4$ is a single bond, a methylene group, an ethylene group, a phenylene group, a fluorinated phenylene group, $-O-Z^{41}-$, $-C(=O)-O-Z^{41}-$ or $-C(=O)-NH-Z^{41}-$, $Z^{41}$ is an alkanediyl group having 1 to 12 carbon atoms, and may contain a carbonyl group, an ester bond or an ether bond;

$R^9$ to $R^{11}$ each independently represent a hydrocarbon group which is linear having 1 to 10 carbon atoms, or branched or cyclic having 3 to 10 carbon atoms, and two of which may be bonded to each other to form a ring;

in the above-mentioned formula (b-1), $R^{12}$ is a hydrogen atom or a methyl group;

$Z^5$ is a single bond, a methylene group, an ethylene group, a phenylene group, a fluorinated phenylene group, $-O-Z^{51}-$, $-C(=O)-O-Z^{51}-$ or $-C(=O)-NH-Z^{51}-$, $Z^{51}$ is an alkanediyl group having 1 to 12 carbon atoms, and may contain a carbonyl group, an ester bond or an ether bond;

n1 is an integer of 1 to 3, n2 is an integer of 0 to 3 and a sum of n1 and n2 is 5 or less;

$R^{13}$ is a fluorine atom, an iodine atom, or a hydrocarbon group which is linear having 1 to 10 carbon atoms, or branched or cyclic having 3 to 10 carbon atoms, $-CH_2-$ constituting the hydrocarbon group may be replaced by $-O-$, $-C(=O)-O-$ or $-C(=O)-$, or a hydrogen atom constituting the hydrocarbon group may be substituted with a halogen atom or a hetero atom;

$$Ma-CO_2^-M^{2+} \qquad (B)$$

in the formula (B),

Ma represents a linear, branched or cyclic monovalent hydrocarbon group having 1 to 35 carbon atoms which may contain an oxygen atom(s), and one or more hydrogen atoms bonded to the carbon atom may be substituted with a fluorine atom(s); and $M^{2+}$ represents a counter cation having a substituent(s), and is a sulfonium cation, an iodonium cation or an ammonium cation.

2. The resist composition according to claim 1, wherein the polymer compound further contains a repeating unit having a lactone structure represented by the following general formula (c-1):

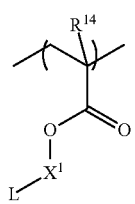
(c-1)

in the formula (c-1), $R^{14}$ is a hydrogen atom or a methyl group;

$X^1$ is a single bond or a hydrocarbon group having 1 to 5 carbon atoms and —$CH_2$— constituting the hydrocarbon group may be replaced by —O—, —C(=O)—O— or —C(=O)—; and L is a group having a lactone structure.

3. The resist composition according to claim 2, wherein L in the formula (c-1) is a group represented by any of the following formulae (c-1-1), (c-1-2) and (c-1-3):

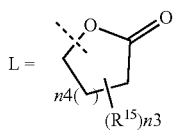
(c-1-1)

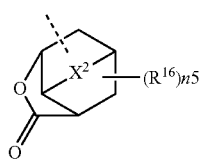
(c-1-2)

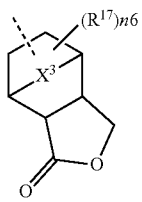
(c-1-3)

in the formula (c-1-1), n3 is an integer of 1 to 4;

$R^{15}$ is a hydrocarbon group which is linear having 1 to 10 carbon atoms, or branched or cyclic having 3 to 10 carbon atoms, —$CH_2$— constituting the hydrocarbon group may be replaced by —O—, —C(=O)—O— or —C(=O)—, or a hydrogen atom constituting the hydrocarbon group may be substituted with a halogen atom or a hetero atom;

n4 represents a linking group having 1 to 5 carbon atoms;

in the formula (c-1-2), $X^2$ is a single bond or a hydrocarbon group having 1 to 5 carbon atoms and —$CH_2$— constituting the hydrocarbon group may be replaced by —O— or —C(=O)—;

n5 is an integer of 1 to 4;

$R^{16}$ is a hydrocarbon group which is linear having 1 to 10 carbon atoms, or branched or cyclic having 3 to 10 carbon atoms, —$CH_2$— constituting the hydrocarbon group may be replaced by —O—, —C(=O)—O— or —C(=O)—, or a hydrogen atom constituting the hydrocarbon group may be substituted with a halogen atom or a hetero atom;

in the formula (c-1-3), $X^3$ is a single bond or a hydrocarbon group having 1 to 5 carbon atoms and —$CH_2$— constituting the hydrocarbon group may be replaced by —O— or —C(=O)—;

n6 is an integer of 1 to 4; and $R^{17}$ is a hydrocarbon group which is linear having 1 to 10 carbon atoms, or branched or cyclic having 3 to 10 carbon atoms, —$CH_2$— constituting the hydrocarbon group may be replaced by —O—, —C(=O)—O— or —C(=O)—, or a hydrogen atom constituting the hydrocarbon group may be substituted with a halogen atom or a hetero atom.

4. The resist composition according to claim 1, wherein the salt represented by the general formula (B) is a salt represented by the following formula (B1):

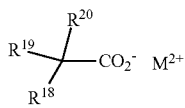
(B1)

in the formula (B1), $R^{18}$ to $R^{19}$ each independently represent a hydrogen atom, a fluorine atom or a trifluoromethyl group;

$R^{20}$ represents a hydrogen atom, a hydroxyl group, a linear, branched or cyclic, substituted or unsubstituted alkyl group having 1 to 20 carbon atoms, or a substituted or unsubstituted aryl group having 6 to 30 carbon atoms; and $M^{2+}$ represents a counter cation having a substituent(s), a sulfonium cation, an iodonium cation or an ammonium cation.

5. The resist composition according to claim 2, wherein the salt represented by the general formula (B) is a salt represented by the following formula (B1):

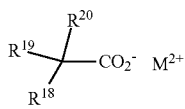
(B1)

in the formula (B1), $R^{18}$ to $R^{19}$ each independently represent a hydrogen atom, a fluorine atom or a trifluoromethyl group;

$R^{20}$ represents a hydrogen atom, a hydroxyl group, a linear, branched or cyclic, substituted or unsubstituted alkyl group having 1 to 20 carbon atoms, or a substituted or unsubstituted aryl group having 6 to 30 carbon atoms; and $M^{2+}$ represents a counter cation having a substituent(s), a sulfonium cation, an iodonium cation or an ammonium cation.

6. The resist composition according to claim 3, wherein the salt represented by the general formula (B) is a salt represented by the following formula (B1):

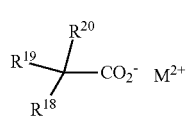

(B1)

in the formula (B1),
$R^{18}$ to $R^{19}$ each independently represent a hydrogen atom, a fluorine atom or a trifluoromethyl group;
$R^{20}$ represents a hydrogen atom, a hydroxyl group, a linear, branched or cyclic, substituted or unsubstituted alkyl group having 1 to 20 carbon atoms, or a substituted or unsubstituted aryl group having 6 to 30 carbon atoms; and
$M^{2+}$ represents a counter cation having a substituent(s), a sulfonium cation, an iodonium cation or an ammonium cation.

7. The resist composition according to claim 1, which further comprises a salt represented by the following formula (B2):

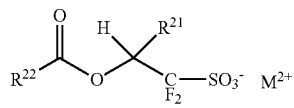

(B2)

in the formula (B2),
$R^{21}$ represents a hydrogen atom or a trifluoromethyl group;
$R^{22}$ represents a linear, branched or cyclic monovalent hydrocarbon group having 1 to 35 carbon atoms which may contain an oxygen atom(s), and one or more hydrogen atoms bonded to the carbon atom may be substituted with a fluorine atom(s); and
$M^{2+}$ represents a counter cation having a substituent(s), a sulfonium cation, an iodonium cation or an ammonium cation.

8. The resist composition according to claim 2, which further comprises a salt represented by the following formula (B2):

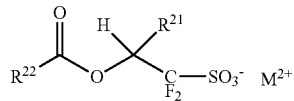

(B2)

in the formula (B2),
$R^{21}$ represents a hydrogen atom or a trifluoromethyl group;
$R^{22}$ represents a linear, branched or cyclic monovalent hydrocarbon group having 1 to 35 carbon atoms which may contain an oxygen atom(s), and one or more hydrogen atoms bonded to the carbon atom may be substituted with a fluorine atom(s); and
$M^{2+}$ represents a counter cation having a substituent(s), a sulfonium cation, an iodonium cation or an ammonium cation.

9. The resist composition according to claim 3, which further comprises a salt represented by the following formula (B2):

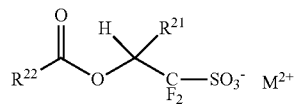

(B2)

in the formula (B2),
$R^{21}$ represents a hydrogen atom or a trifluoromethyl group;
$R^{22}$ represents a linear, branched or cyclic monovalent hydrocarbon group having 1 to 35 carbon atoms which may contain an oxygen atom(s), and one or more hydrogen atoms bonded to the carbon atom may be substituted with a fluorine atom(s); and
$M^{2+}$ represents a counter cation having a substituent(s), a sulfonium cation, an iodonium cation or an ammonium cation.

10. The resist composition according to claim 1, wherein the repeating unit represented by the formula (a-2) is a repeating unit represented by the following formula (a-2-1):

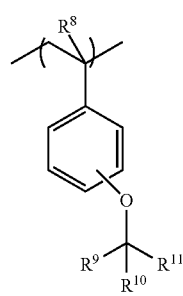

(a-2-1)

in the formula (a-2-1), $R^8$ to $R^{11}$ are as defined above.

11. The resist composition according to claim 2, wherein the repeating unit represented by the formula (a-2) is a repeating unit represented by the following formula (a-2-1):

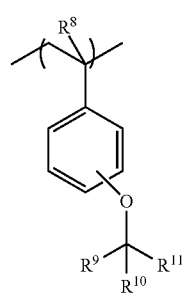

(a-2-1)

in the formula (a-2-1), $R^8$ to $R^{11}$ are as defined above.

12. The resist composition according to claim 3, wherein the repeating unit represented by the formula (a-2) is a repeating unit represented by the following formula (a-2-1):

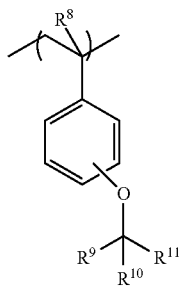

(a-2-1)

in the formula (a-2-1), $R^8$ to $R^{11}$ are as defined above.

13. A patterning process for forming a pattern on a substrate which comprises: forming a resist film on the substrate using the resist composition according to claim 1, laying a mask over the resist film, exposing the film by irradiating a high energy beam, and then, developing with an alkali developing solution to form a pattern on the substrate, wherein the exposure with the high energy beam is carried out by a KrF excimer laser having a wavelength of 248 nm, an ArF excimer laser having a wavelength of 193 nm, EUV having a wavelength of 13.5 nm, or electron beam.

14. A patterning process for forming a pattern on a substrate which comprises: forming a resist film on the substrate using the resist composition according to claim 2, laying a mask over the resist film, exposing the film by irradiating a high energy beam, and then, developing with an alkali developing solution to form a pattern on the substrate, wherein the exposure with the high energy beam is carried out by a KrF excimer laser having a wavelength of 248 nm, an ArF excimer laser having a wavelength of 193 nm, EUV having a wavelength of 13.5 nm, or electron beam.

15. A patterning process for forming a pattern on a substrate which comprises: forming a resist film on the substrate using the resist composition according to claim 3, laying a mask over the resist film, exposing the film by irradiating a high energy beam, and then, developing with an alkali developing solution to form a pattern on the substrate, wherein the exposure with the high energy beam is carried out by a KrF excimer laser having a wavelength of 248 nm, an ArF excimer laser having a wavelength of 193 nm, EUV having a wavelength of 13.5 nm, or electron beam.

* * * * *